(12) United States Patent
Lee et al.

(10) Patent No.: US 12,581,817 B2
(45) Date of Patent: Mar. 17, 2026

(54) DISPLAY DEVICE INCLUDING INPUT SENSOR WITH INCREASED SENSITIVITY

(71) Applicant: SAMSUNG DISPLAY CO., LTD.,
Yongin-si (KR)

(72) Inventors: Dong-Hoon Lee, Hwaseong-si (KR);
Donguk Kang, Suwon-si (KR);
Hyunjoon Kim, Hwaseong-si (KR);
Haemin Kim, Gumi-si (KR);
Myunghoon Park, Suwon-si (KR);
Byungchang Yu, Seosan-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 660 days.

(21) Appl. No.: 18/053,317

(22) Filed: Nov. 7, 2022

(65) Prior Publication Data

US 2023/0157107 A1      May 18, 2023

(30) Foreign Application Priority Data

Nov. 17, 2021      (KR) ......................... 10-2021-0158624

(51) Int. Cl.
*H10K 59/131*      (2023.01)
*G06F 3/041*      (2006.01)
*G06F 3/044*      (2006.01)
*H10K 59/40*      (2023.01)

(52) U.S. Cl.
CPC ......... *H10K 59/131* (2023.02); *G06F 3/0412*
(2013.01); *G06F 3/0443* (2019.05); *G06F
3/0446* (2019.05); *G06F 2203/04107*
(2013.01); *G06F 2203/04111* (2013.01); *H10K
59/40* (2023.02)

(58) Field of Classification Search
CPC .... H10K 59/131; H10K 59/40; G06F 3/0412;
G06F 3/0443; G06F 3/0446; G06F
3/04164; G06F 3/0418; G06F
2203/04107; G06F 2203/04111
See application file for complete search history.

(56) References Cited

U.S. PATENT DOCUMENTS

| | | | |
|---|---|---|---|
| 10,528,168 B2 | 1/2020 | Ye | |
| 2019/0237533 A1* | 8/2019 | Kim ..................... | G09G 3/3275 |
| 2020/0212116 A1 | 7/2020 | Kim et al. | |

FOREIGN PATENT DOCUMENTS

KR      10-2016-0074      6/2016

\* cited by examiner

*Primary Examiner* — William B Partridge
*Assistant Examiner* — Chevy J Boegel
(74) *Attorney, Agent, or Firm* — F. CHAU &
ASSOCIATES, LLC

(57) ABSTRACT

A display device includes a first electrode portion that
overlaps a first sensing electrode of an input sensor, a second
electrode portion spaced apart from the first electrode por-
tion and that overlaps a second sensing electrode of the input
sensor, a voltage line of a first group that is connected to the
first electrode portion, and a voltage line of a second group
that is connected to the second electrode portion. The first
electrode portion and the second electrode portion corre-
spond to an electrode of a light emitting element.

22 Claims, 20 Drawing Sheets

DP

PX

DP-DA

DP-NDA

TR1

Cst

TR2

OLED

ELVSS

PX

GDC

SGL

DL     CSL     GL     PL     ELVDD

DR2

DR1

DISPLAY DEVICE INCLUDING INPUT SENSOR WITH INCREASED SENSITIVITY

CROSS REFERENCE TO RELATED APPLICATION(S)

This U.S. non-provisional patent application claims priority under 35 U.S.C. § 119 from Korean Patent Application No. 10-2021-0158624, filed on Nov. 17, 2021 in the Korean Intellectual Property Office, the contents of which are herein incorporated by reference in their entirety.

TECHNICAL FIELD

Embodiments of the present disclosure are directed to a display device. More particularly, the present disclosure relates to a display device including an input sensor.

DISCUSSION OF THE RELATED ART

Electronic devices, such as smart phones, tablet computers, notebook computers, navigation devices, and smart televisions, include a display device to provide information. Electronic devices further include various electronic modules in addition to a display device.

Current display devices include an input sensor as its information input device.

SUMMARY

Embodiments of the present disclosure provide a display device that includes an input sensor with increased sensitivity.

Embodiments of the inventive concept provide a display device that includes a display panel that includes a plurality of light emitting areas and a non-light-emitting area adjacent to the light emitting areas and an input sensor disposed directly on the display panel and that includes a first sensing electrode and a second sensing electrode capacitively coupled to the first sensing electrode. The display panel further includes a first electrode portion that overlaps the first sensing electrode, a second electrode portion spaced apart from the first electrode portion and that overlaps the second sensing electrode, a voltage line of a first group connected to the first electrode portion, a voltage line of a second group connected to the second electrode portion, an insulating layer that is disposed between the first and second electrode portions and the voltage line of the first group and is disposed between the first and second electrode portions and the voltage line of the second group, a plurality of first electrodes disposed between the first electrode portion and the insulating layer and between the second electrode portion and the insulating layer and that overlap the light emitting areas, and a plurality of light emitting layers, where each of the light emitting layers is disposed between a corresponding electrode portion of the first electrode portion and the second electrode portion and a corresponding first electrode of the first electrodes.

The first sensing electrode extends in a first direction, the second sensing electrode extends in a second direction that crosses the first direction, and each voltage line of the first group and each voltage line of the second group extends in the second direction.

The first sensing electrode includes a plurality of first sensing portions arranged in the first direction and first intermediate portions that connect adjacent first sensing portions. The second sensing electrode includes a plurality of second sensing portions arranged in the second direction and second intermediate portions that connect adjacent second sensing portions. The first intermediate portions are disposed on a layer that differs from a layer on which the second intermediate portions are disposed. The voltage line of the first group is connected to a corresponding first sensing portion of the first sensing portions, and the voltage line of the second group is connected to each of the second sensing portions.

A plurality of voltage lines of the first group are provided, a plurality of voltage lines of the second group are provided, and voltage lines of the first group are alternately arranged in the first direction with voltage lines of the second group.

Each voltage line of the first group and each voltage line of the second group overlaps the first electrode portion and the second electrode portion.

The voltage line of the first group and the voltage line of the second group receives a same bias voltage.

The display panel further includes a voltage supply line disposed outside of the first sensing electrode and the second sensing electrode when viewed in a plan view, and the voltage line of the first group and the voltage line of the second group are electrically connected to the voltage supply line.

The voltage line of the first group is connected to the first electrode portion via a contact hole formed through the insulating layer.

Each voltage line of the first group and each voltage line of the second group has a sheet resistance that is less than that of the first electrode portion and the second electrode portion.

The first electrode portion and the second electrode portion are spaced apart from each other in the non-light-emitting area.

The display panel further includes an electron transport layer. The electron transport layer is disposed between a corresponding light emitting layer of the plurality of light emitting layers and the corresponding electrode portion. The electron transport layer is not disposed in an area where the first electrode portion and the second electrode portion are spaced apart from each other.

The voltage line of the first group includes a first layer, a second layer disposed on the first layer, and a third layer disposed on the second layer, and the second layer has an electrical conductivity greater than that of the first layer and the third layer.

The second layer has a thickness greater than that of the first layer and the third layer, and the second layer includes an inclined side surface.

The insulating layer includes an opening through which a portion of the voltage line of the first group is exposed, and the first electrode portion is in contact with the inclined side surface of the second layer in the opening.

The display panel further includes an organic pattern disposed on the third layer and a conductive pattern disposed on the organic pattern.

The display panel further includes a transistor and a connection electrode electrically connected to the transistor. The voltage line of the first group and the voltage line of the second group are disposed on a same layer as a layer on which the connection electrode is disposed.

The display panel further includes a transistor and a data line electrically connected to the transistor. The voltage line of the first group and the voltage line of the second group are disposed on a same layer as a layer on which the data line is disposed.

Embodiments of the inventive concept provide a display device that includes a display panel that includes a plurality of light emitting areas and a non-light-emitting area adjacent to the light emitting areas, and an input sensor disposed directly on the display panel and that includes a first sensing electrode and a second sensing electrode capacitively coupled to the first sensing electrode. The display panel further includes a voltage line that overlaps at least one of the first sensing electrode or the second sensing electrode, an insulating layer disposed on the voltage line, a first electrode disposed on the insulating layer and in each of the light emitting areas, a pixel definition layer disposed on the insulating layer and that includes an opening formed therethrough that exposes the first electrode, a light emitting layer disposed on the first electrode, and a second electrode disposed on the pixel definition layer and the light emitting layer and that overlaps the light emitting areas. The second electrode is electrically connected to the voltage line.

The first sensing electrode extends in a first direction, the second sensing electrode extends in a second direction that crosses the first direction, and the voltage line includes at least one group of voltage lines of a first group that extend in the first direction and voltage lines of a second group that extend in the second direction.

The voltage line includes an inclined side surface, the insulating layer includes a first opening formed therethrough that exposes a portion of the voltage line, the pixel definition layer includes a second opening formed therethrough that corresponds to the first opening, and the second electrode is in contact with the inclined side surface of the voltage line in the first opening.

Embodiments of the inventive concept provide a display panel that includes a plurality of light emitting areas and a non-light-emitting area adjacent to the light emitting areas; and an input sensor disposed directly on the display panel and that includes a first sensing electrode and a second sensing electrode capacitively coupled to the first sensing electrode. The display panel further includes a first electrode portion that overlaps the first sensing electrode; a second electrode portion spaced apart from the first electrode portion and that overlaps the second sensing electrode; a voltage line of a first group connected to the first electrode portion; a voltage line of a second group connected to the second electrode portion; and an insulating layer that is disposed between the first and second electrode portions and the voltage line of the first group and is disposed between the first and second electrode portions and the voltage line of the second group. The voltage line of the first group is connected to the first electrode portion via a contact hole formed through the insulating layer, and each voltage line of the first group and each voltage line of the second group has a sheet resistance that is less than that of the first electrode portion and the second electrode portion.

The display device further includes a plurality of first electrodes that overlaps the light emitting areas and are disposed between the first electrode portion and the insulating layer and between the second electrode portion and the insulating layer; and a plurality of light emitting layers, wherein each light emitting layer is disposed between a corresponding electrode portion of the first electrode portion and the second electrode portion and a corresponding first electrode of the first electrodes.

According to the above, a current path that passes through a parasitic capacitance formed between the sensing electrode and the second electrode of the light emitting element is removed. As the voltage line is connected to the second electrode of the light emitting element, the current path is formed through the voltage line. A voltage drop is reduced due to the connection between the second electrode of the light emitting element and the voltage line.

The second electrode of the light emitting element is divided into two portions that respectively correspond to the first sensing electrode and the second sensing electrode, and thus, an impedance of the current path that passes through the parasitic capacitance formed between the sensing electrode and the second electrode of the light emitting element increases. The current path does not pass through the parasitic capacitance formed between the sensing electrode and the second electrode of the light emitting element, but passes through the voltage line connected to portions of the second electrode of the light emitting element.

As the current path passing through the parasitic capacitance is removed, noise does not occur in mutual capacitances that form between the first sensing electrode and the second sensing electrode. Accordingly, the sensitivity of the input sensor is increased.

5
6

Figure 10A:
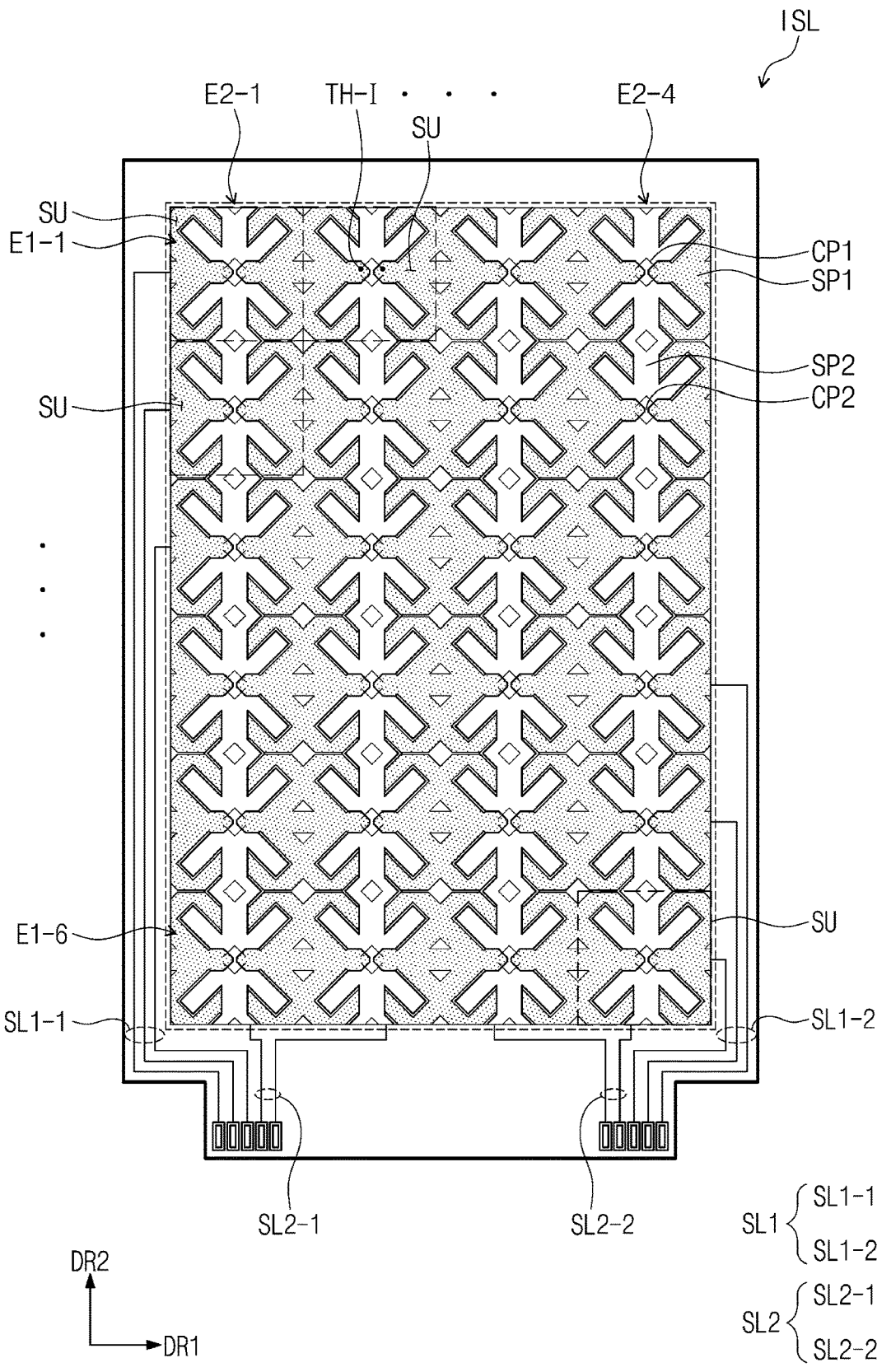
FIG. 10A is a plan view of an input sensor according to an embodiment of the present disclosure.
Figure 10B:
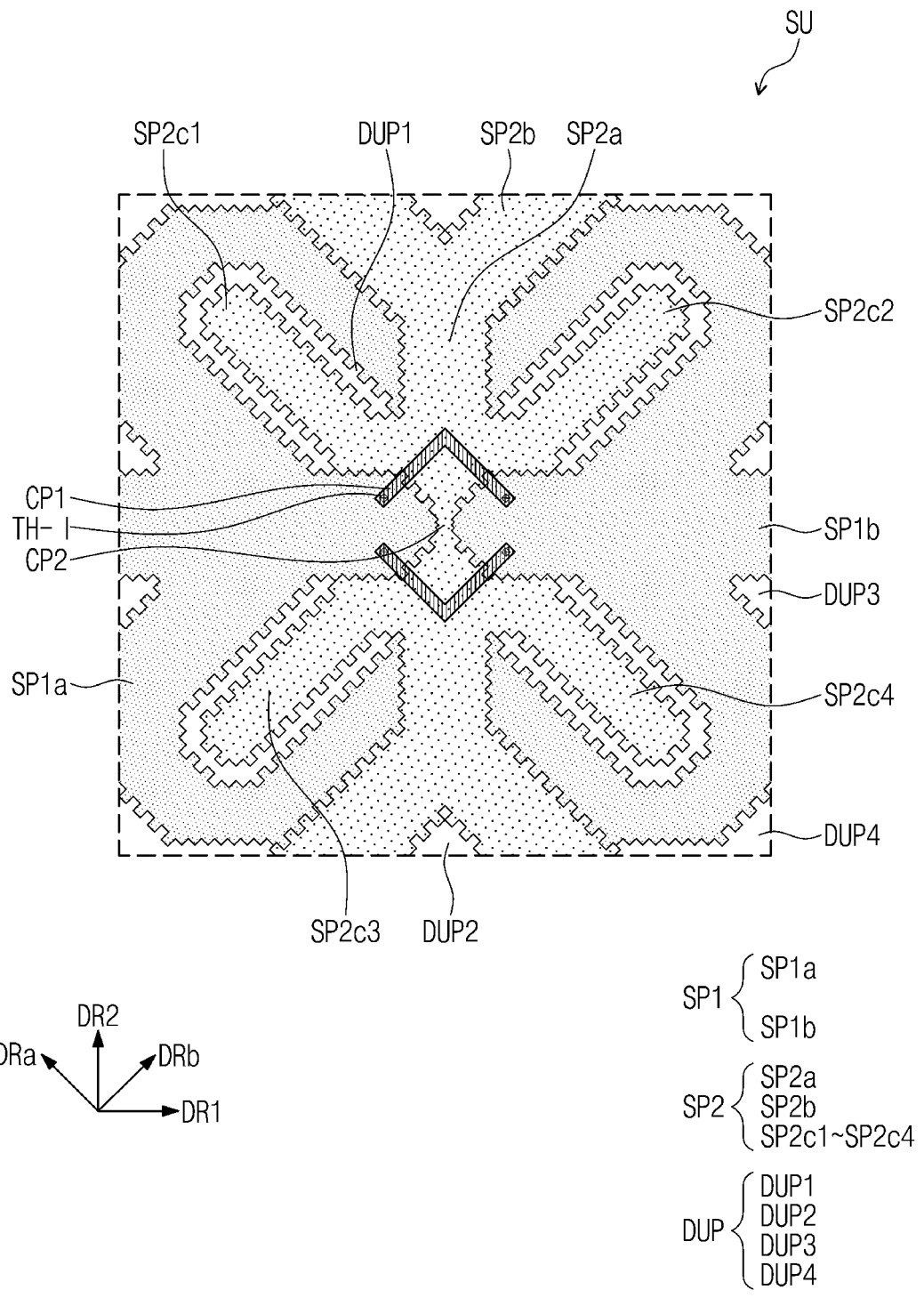
FIG. 10B is an enlarged plan view of a sensing unit shown in FIG. 10A.
Figure 10C:
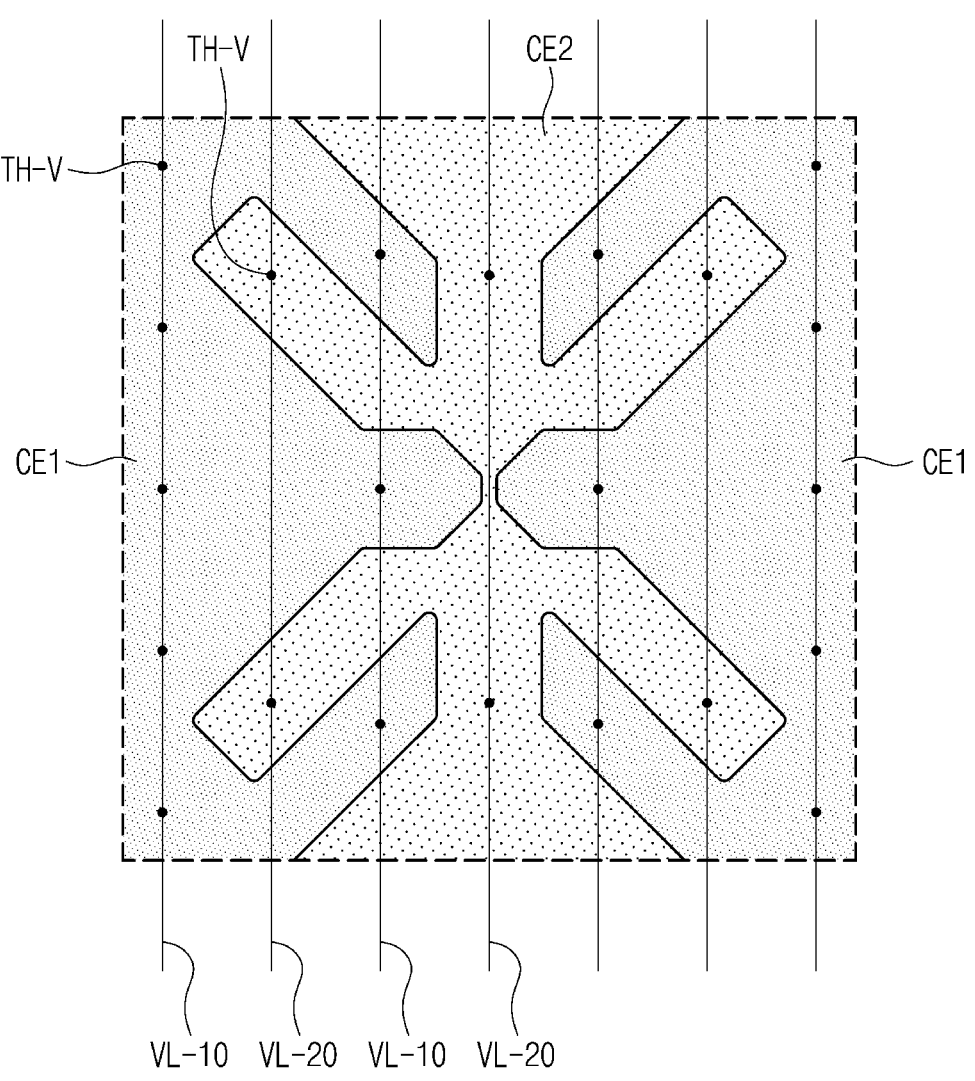
Figure 10C:
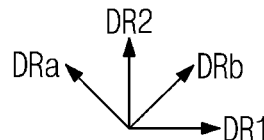

FIG. 10C is an enlarged plan view of a second electrode that corresponds to a sensing unit shown in FIG. 10B.

DETAILED DESCRIPTION

In the present disclosure, it will be understood that when an element, or area, layer, or portion, is referred to as being "on", "connected to" or "coupled to" another element or layer, it can be directly on, connected or coupled to the other element or layer or intervening elements or layers may be present.

Like numerals may refer to like elements throughout.

Hereinafter, embodiments of the present disclosure will be described with reference to accompanying drawings.

Figure 1:
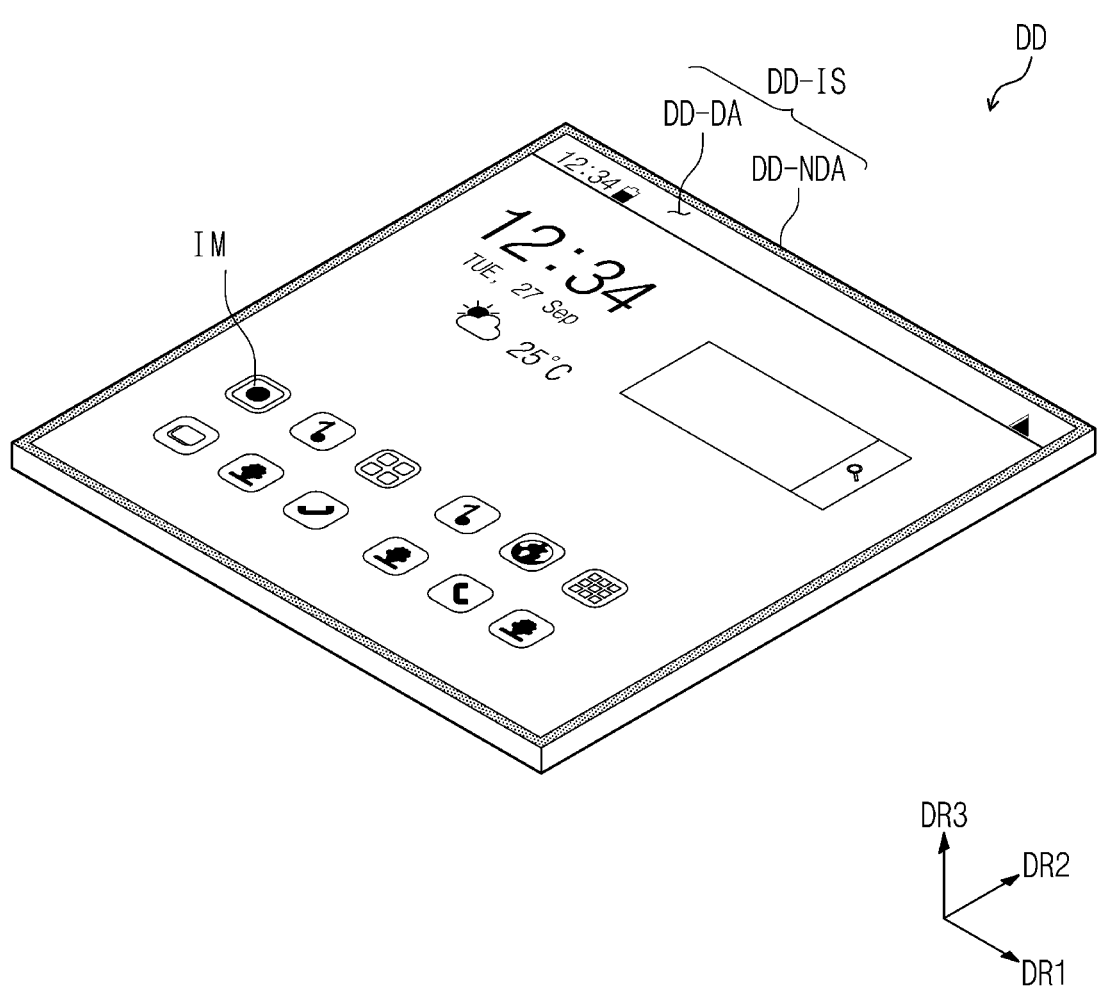
FIG. 1 is a perspective view of a display device according to an embodiment of the present disclosure.
Figure 2A:
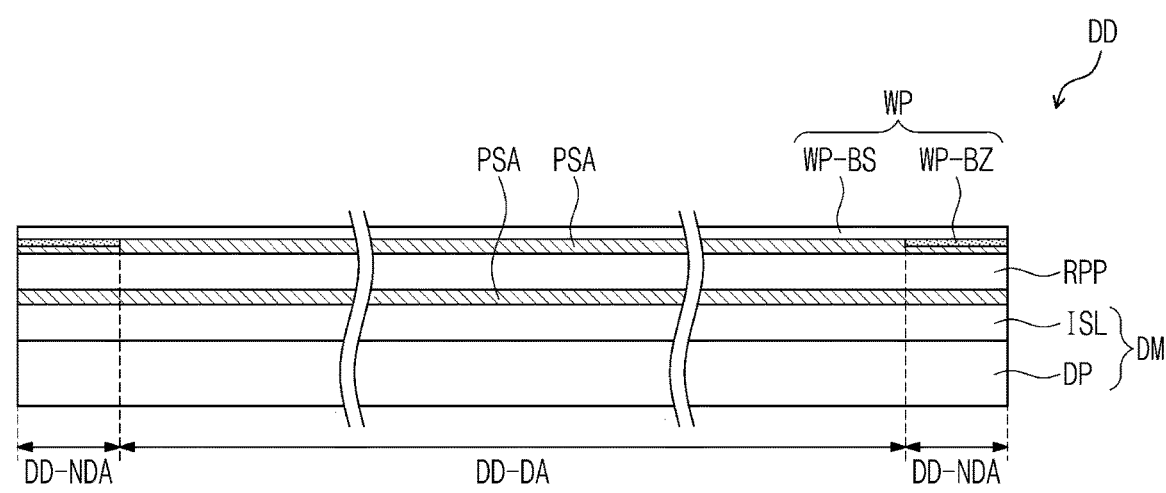
FIGS. 2A and 2B are cross-sectional views of display devices according to embodiments of the present disclosure.
Figure 2A:
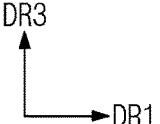
Figure 2B:
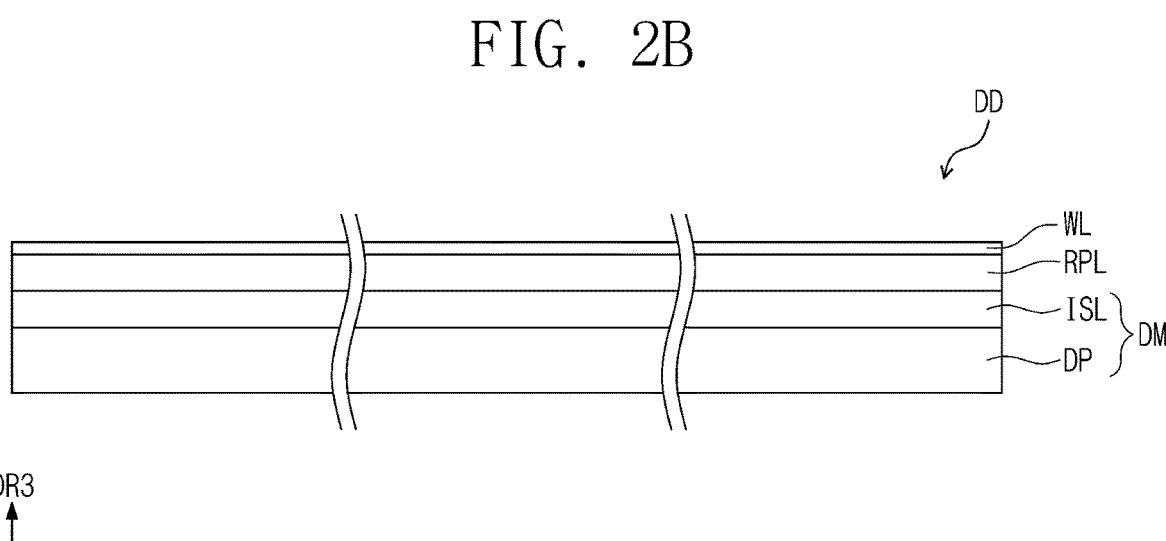

FIG. 1 is a perspective view of a display device DD according to an embodiment of the present disclosure. FIGS. 2A and 2B are cross-sectional views of display devices DD according to embodiments of the present disclosure.

Referring to FIG. 1, in an embodiment, a display surface DD-IS of the display device DD is substantially parallel to a plane defined by a first directional axis DR1 and a second directional axis DR2. In a present embodiment, the display surface DD-IS has a square shape as a representative example, however, embodiments are not necessarily limited thereto. In an embodiment, the display surface DD-IS has a rectangular shape with a relatively larger width in the first directional axis DR1 or a relatively larger width in the second directional axis DR2.

A third directional axis DR3 indicates a normal line direction of the display surface DD-IS, i.e., a thickness direction of the display device DD that is perpendicular to the plane defined by the first directional axis DR1 and the second directional axis DR2. Front (or upper) and rear (or lower) surfaces of each member are distinguished from each other with respect to the third directional axis DR3. However, directions indicated by the first, second, and third directional axes DR1, DR2, and DR3 are relative to each other and may be changed to other directions. Hereinafter, first, second, and third directions correspond to directions respectively indicated by the first, second, and third directional axes DR1, DR2, and DR3 in FIG. 1 and are assigned with the same reference numerals as the first, second, and third directional axes DR1, DR2, and DR3.

As shown in FIG. 1, the display surface DD-IS includes a display area DD-DA through which an image IM is displayed and a non-display area DD-NDA adjacent to the display area DD-DA. The image IM is not displayed through the non-display area DD-NDA. FIG. 1 shows icon images as representative examples of the image IM. The display area DD-DA has a rectangular shape. The non-display area DD-NDA surrounds the display area DD-DA, however, embodiments are not necessarily limited thereto. The shape of the display area DD-DA and the shape of the non-display area DD-NDA may be designed in relation to each other.

As shown in FIG. 1, the display device DD may be a rigid type display device, however, embodiments are not necessarily limited thereto. According to an embodiment, the display device DD includes a plurality of areas defined according to their operation state. For example, the display device DD includes a folding area that is folded with respect to a folding axis and a non-folding area that is not folded.

In a present embodiment, the display device DD incorporated into a tablet computer is illustrated as a representative example, however, embodiments are not necessarily particularly limited. According to an embodiment, the display device DD is incorporated into a large-sized electronic item, such as a television set or a monitor, or a small-sized electronic item, such as a mobile phone, a game unit, or a smart watch.

FIGS. 2A and 2B are cross-sectional views defined by the first directional axis DR1 and the third directional axis DR3.

The display device DD includes a display panel, an input sensor, an anti-reflective unit, and a window. At least some components of the display panel, the input sensor, the anti-reflective unit, and the window are formed through successive processes or are attached to each other by an adhesive member. FIG. 2A shows a pressure sensitive adhesive (PSA) film as the adhesive member. The adhesive member described hereinafter includes a conventional adhesive, but is not necessarily particularly limited. According to an embodiment, the anti-reflective unit is replaced with another component or may be omitted.

In FIGS. 2A and 2B, a component of the input sensor, the anti-reflective unit, and the window that is formed through the successive processes with another component is referred to as a "layer". A component of the input sensor, the anti-reflective unit, and the window that is coupled to another component by the adhesive member is referred to as a "panel". A panel includes a base layer that provides a base surface, such as a synthetic resin film, a composite material film, or a glass substrate, however, in an embodiment, the base layer is omitted from a component that is referred to as a "layer". For example, a component that is referred to as a "layer" is disposed on a base surface provided by another component.

The input sensor, the anti-reflective unit, and the window are respectively referred to as an input sensing panel, an anti-reflective panel, and a window panel, or as an input sensing layer, an anti-reflective layer, and a window layer, depending on the presence or absence of a base layer.

As shown in FIG. 2A, in an embodiment, the display device DD includes a display panel DP, an input sensing layer ISL, an anti-reflective panel RPP, and a window panel WP. The input sensing layer ISL is disposed directly on the display panel DP. In the present disclosure, the expression "a component B1 is disposed directly on a component A1" means that no intervening elements are present between the component B1 and the component A1. The component B1 is formed on a base surface provided by the component A1 through successive processes after the component A1 is formed.

The display panel DP and the input sensing layer ISL may be defined as a display module DM. The pressure sensitive adhesive (PSA) film is disposed between the display module DM and the anti-reflective panel RPP and between the anti-reflective panel RPP and the window panel WP.

The display panel DP generates an image, and the input sensing layer ISL obtains coordinate information of an external input, such as a touch event. The display panel DP is a light emitting type display panel, however, embodiments are not necessarily particularly limited. For instance, in embodiments, the display panel DP is an organic light emitting display panel or an inorganic light emitting display panel. A light emitting layer of an organic light emitting display panel includes an organic light emitting material. A light emitting layer of an inorganic light emitting display panel includes a micro-LED, a nano-LED, a quantum dot, or a quantum rod. Hereinafter, an organic light emitting display panel will be described as a representative example of the display panel DP.

The anti-reflective panel RPP reduces reflectance of natural light or sunlight incident thereto from outside the window panel WP. The anti-reflective panel RPP includes a retarder and a polarizer. The retarder may be a film type or a liquid crystal coating type and may include a λ/2 retarder and/or a λ/4 retarder. The polarizer may be a film type or a liquid crystal coating type. A film type retarder and a film type polarizer each include a stretching type synthetic resin film, and a liquid crystal coating type retarder and a liquid crystal coating type polarizer each include liquid crystals arranged in a predetermined arrangement. The polarizer and the retarder further include a protective film. The retarder and the polarizer or the protective film function as a base layer of the anti-reflective panel RPP.

According to an embodiment, the anti-reflective panel RPP includes color filters. The color filters have a predetermined arrangement. The arrangement of the color filters is determined by the emission colors of pixels in the display panel DP. The anti-reflective panel RPP further includes a black matrix disposed adjacent to the color filters.

The window panel WP includes a base layer WP-BS and a light shielding pattern WP-BZ. The base layer WP-BS may include a glass substrate and/or a synthetic resin film, however, the base layer WP-BS is not necessarily limited to a single-layer structure. In an embodiment, the base layer WP-BS includes two or more films coupled to each other by the adhesive member.

The light shielding pattern WP-BZ partially overlaps with the base layer WP-BS. The light shielding pattern WP-BZ is disposed on a rear surface of the base layer WP-BS, and the light shielding pattern WP-BZ substantially defines a bezel area, such as the non-display area DD-NDA of the display device DD shown in FIG. 1.

The bezel pattern WP-BZ is a colored organic layer and is formed through a coating process. In addition, the window panel WP further includes a functional coating layer disposed on a front surface of the base film WP-BS. The functional coating layer may include an anti-fingerprint layer, an anti-reflective layer, or a hard coating layer.

Referring to FIG. 2B, in an embodiment, the display device DD includes a display panel DP, an input sensing layer ISL, an anti-reflective layer RPL, and a window layer WL. Adhesive members are omitted from the display device DD, and the input sensing layer ISL, the anti-reflective layer RPL, and the window layer WL are formed on a base surface of the display panel DP through successive processes. The anti-reflective layer RPL includes color filters. The anti-reflective layer RPL further includes a black matrix disposed adjacent to the color filters.

The window layer WL includes a protective layer that covers the anti-reflective layer RPL. The window layer WL may include a synthetic resin layer and a light shielding pattern. In the display device DD of FIG. 2B, the window layer WL can be replaced with the window panel WP.

Figure 3:
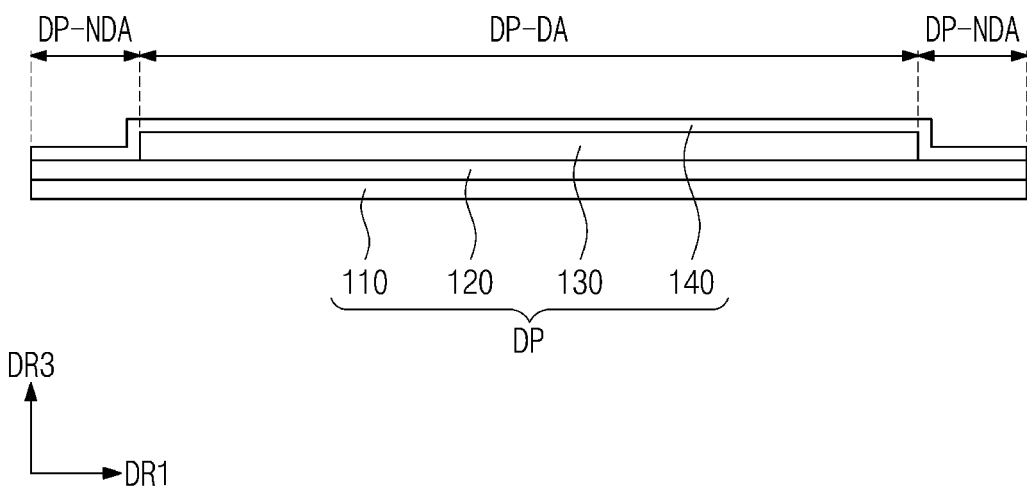
FIG. 3 is a cross-sectional view of a display panel according to an embodiment of the present disclosure.
Figure 4A:
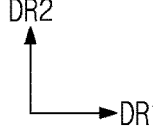
FIG. 4A is a plan view of a display panel according to an embodiment of the present disclosure.
Figure 4B:
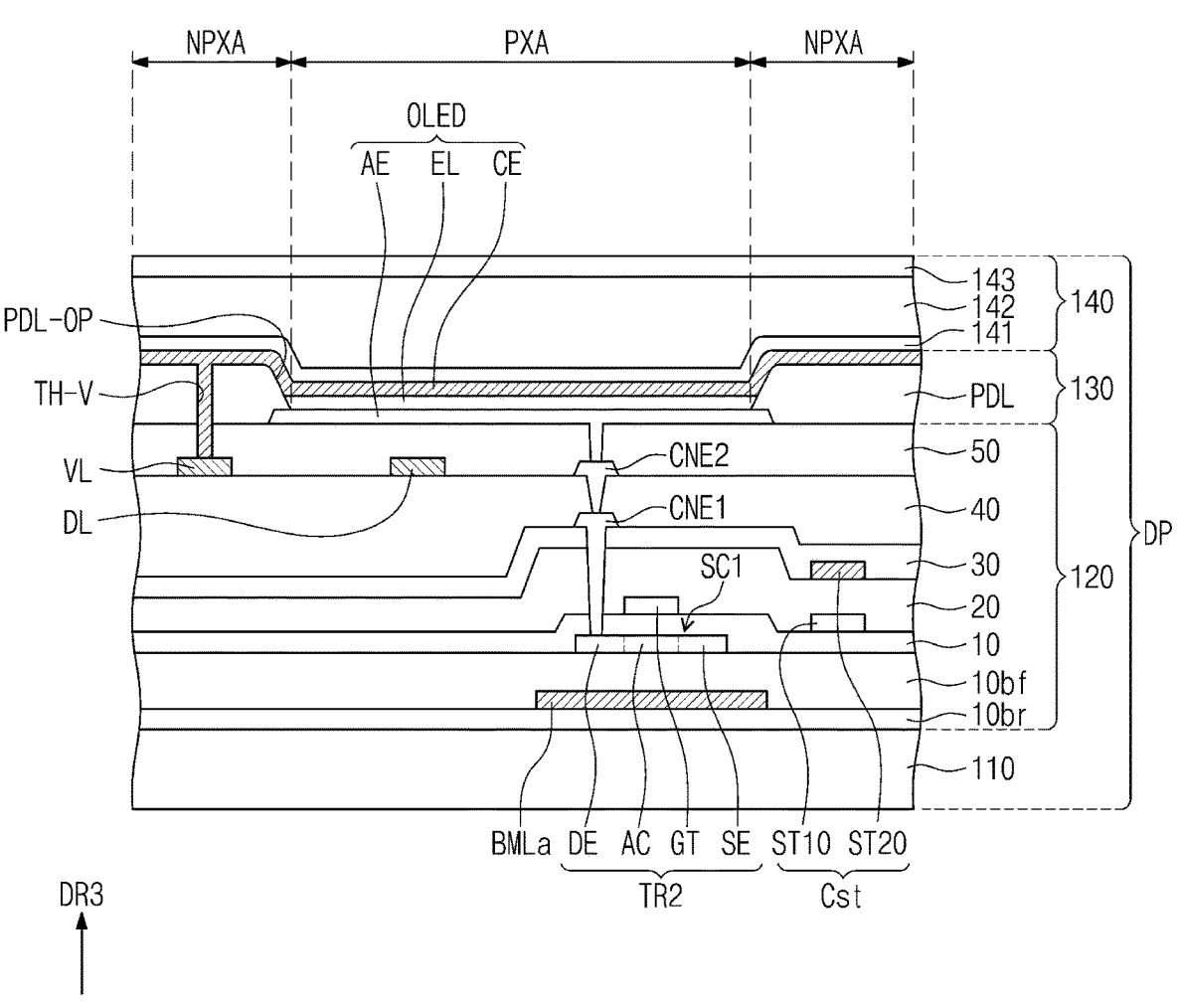
FIG. 4B is a cross-sectional view of a display panel according to an embodiment of the present disclosure.
Figure 4C:
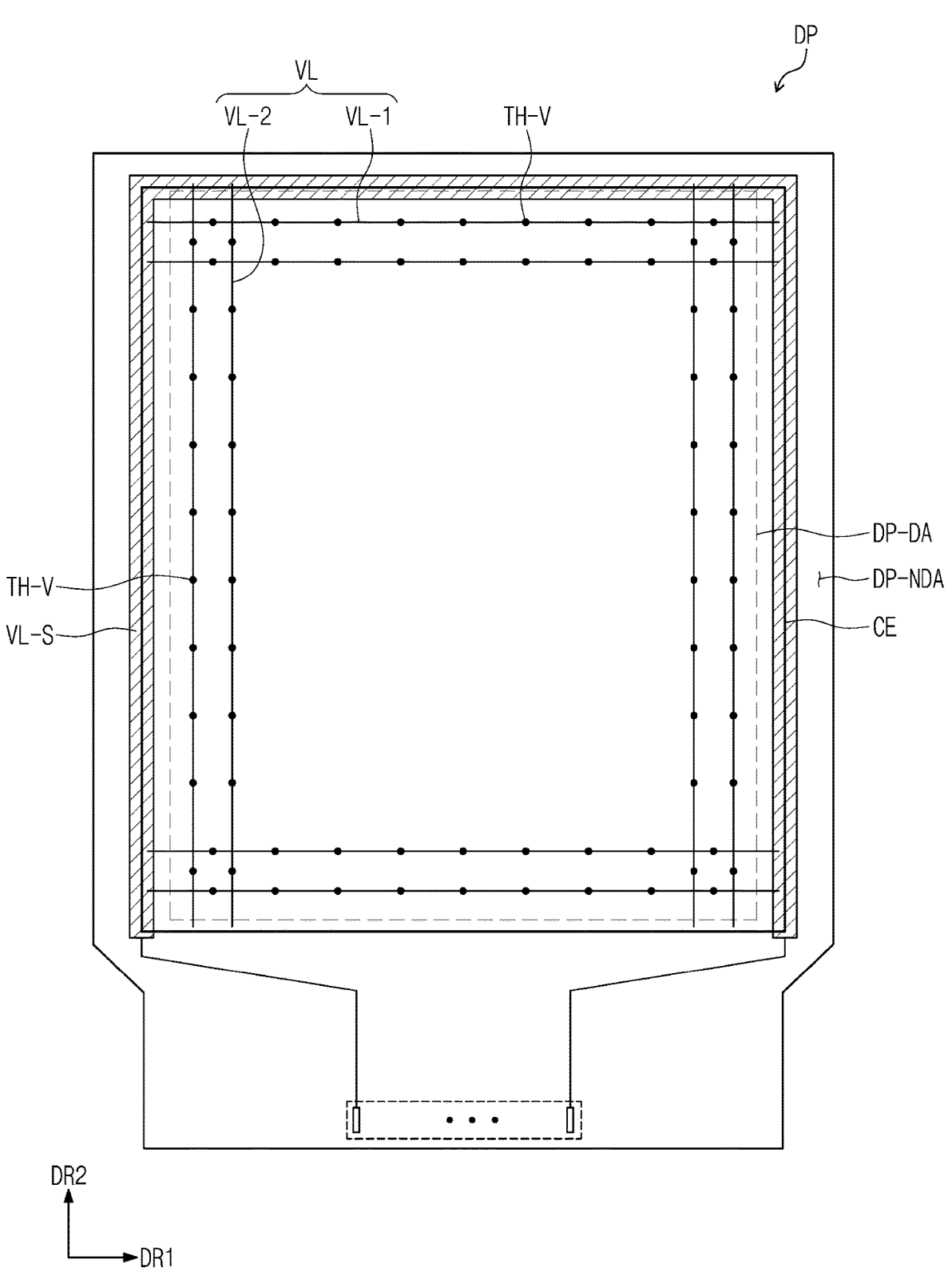
FIG. 4C is a plan view of a second electrode according to an embodiment of the present disclosure.

FIG. 3 is a cross-sectional view of the display panel DP according to an embodiment of the present disclosure. FIG. 4A is a plan view of the display panel DP according to an embodiment of the present disclosure. FIG. 4B is a cross-sectional view of the display panel DP according to an embodiment of the present disclosure. FIG. 4C is a plan view of a second electrode CE according to an embodiment of the present disclosure.

Referring to FIG. 3, in an embodiment, the display panel DP includes a base layer 110, a circuit element layer 120, a display element layer 130, and an encapsulation layer 140. The circuit element layer 120, the display element layer 130, and the encapsulation layer 140 are sequentially disposed on the base layer 110.

The base layer 110 includes a synthetic resin film. A synthetic resin layer is formed on a work substrate used to manufacture the display panel DP. Then, a conductive layer and an insulating layer are disposed on the synthetic resin layer. When the work substrate is removed, the synthetic resin layer corresponds to the base layer 110. The synthetic resin layer includes a heat curable resin. In particular, the synthetic resin layer is a polyimide-based resin layer, however, embodiments are not necessarily particularly limited. In some embodiments, the base layer 110 includes a glass substrate, a metal substrate, or an organic/inorganic composite material substrate.

The circuit element layer 120 includes at least one insulating layer and a circuit element. The circuit element includes a signal line and a pixel driving circuit. The circuit element layer 120 is formed by forming an insulating layer, a semiconductor layer, and a conductive layer by coating and depositing processes and by patterning the insulating layer, the semiconductor layer, and the conductive layer by a photolithography process.

The display element layer 130 includes a light emitting element. The display element layer 130 includes organic light emitting diodes as its light emitting element. The display element layer 130 further includes an organic layer such as a pixel definition layer.

The encapsulation layer 140 encapsulates at least the display element layer 130. A functional thin film may be further disposed under or on the encapsulation layer 140. The thin encapsulation layer includes at least one inorganic layer, hereinafter referred to as an encapsulation inorganic layer. The thin film encapsulation layer includes at least one organic layer, hereinafter referred to as an encapsulation organic layer, and at least one encapsulation inorganic layer. The encapsulation inorganic layer protects the display element layer 130 from moisture and oxygen, and the encapsulation organic layer protects the display element layer 130 from foreign substances such as dust particles.

Referring to FIG. 4A, in an embodiment, the display panel DP includes a driving circuit GDC, a plurality of signal lines SGL, and a plurality of pixels PX.

The driving circuit GDC includes a scan driving circuit. The scan driving circuit generates a plurality of scan signals and sequentially outputs the scan signals to a plurality of scan lines GL described below. The scan driving circuit further outputs other control signals to the driving circuit of the pixels PX.

The scan driving circuit includes a plurality of thin film transistors formed through the same processes, such as a low temperature polycrystalline silicon (LTPS) process or a low temperature polycrystalline oxide (LTPO)) process, as the driving circuit of the pixels PX.

The signal lines SGL include the scan lines GL, data lines DL, a power line PL, and a control signal line CSL. Each of the scan lines GL is connected to one of the pixels PX, and each of the data lines DL is connected to one of the pixels PX. The power line PL is connected to the pixels PX. The power line PL provides a first source voltage ELVDD to the pixels PX. The control signal line CSL provides the scan driving circuit GDC with control signals.

The display area DP-DA is where the pixels PX are arranged. Each of the pixels PX includes a light emitting element OLED and a pixel driving circuit connected to the light emitting element OLED. The OLED is connected to a second source voltage ELVSS. The pixel driving circuit includes, for example, a first transistor TR1, a second transistor TR2, and a capacitor Cst. It is sufficient that the pixel driving circuit includes a switching transistor and a driving transistor, but the pixel driving circuit is not necessarily limited to an embodiment illustrated in FIG. 4A.

FIG. 4B is a cross-sectional view of the display panel DP that corresponds to the pixel PX of FIG. 4A. A light emitting area PXA is defined in every pixel PX. A non-light-emitting area NPXA is defined adjacent to the light emitting areas PXA and forms a boundary between the light emitting areas PXA. FIG. 4B shows the light emitting element OLED and the second transistor TR2 connected to the light emitting element OLED.

A barrier layer 10*br* may be disposed on the base layer 110. The barrier layer 10*br* prevents foreign substances from entering thereinto. The barrier layer 10*br* includes at least one inorganic layer. For example, the barrier layer 10*br* may include a silicon oxide layer and/or a silicon nitride layer. A plurality of each of the silicon oxide layer and the silicon nitride layer may be provided, and the silicon oxide layers and the silicon nitride layers may be alternately stacked with each other.

A shielding electrode BMLa is disposed on the barrier layer 10*br*. The shielding electrode BMLa includes a metal. For example, the shielding electrode BMLa includes one or more of molybdenum (Mo), an alloy including molybdenum (Mo), titanium (Ti), or an alloy including titanium (Ti), which has a good heat resistance. The shielding electrode BMLa receives a bias voltage.

The shielding electrode BMLa prevents an electric potential caused by a polarization phenomenon from exerting influence on the second transistor TR2. The shielding electrode BMLa prevents external light from reaching the second transistor TR2. According to an embodiment, the shielding electrode BMLa is a floating electrode isolated from other electrodes or lines.

A buffer layer 10*bf* is disposed on the barrier layer 10*br*. The buffer layer 10*bf* covers the shielding electrode BMLa. The buffer layer 10*bf* prevents metal atoms or impurities from diffusing from the base layer 110 into a semiconductor pattern SC1 disposed thereon. The buffer layer 10*bf* includes at least one inorganic layer. For example, the buffer layer 10*bf* includes a silicon oxide layer and/or a silicon nitride layer.

The semiconductor pattern SC1 is disposed on the buffer layer 10*bf*. The semiconductor pattern SC1 includes a silicon semiconductor. For example, the silicon semiconductor includes amorphous silicon or polycrystalline silicon. For example, the semiconductor pattern SC1 includes low temperature polycrystalline silicon. In a present embodiment, the second transistor TR2 will be described as a silicon transistor, however, embodiments are necessarily limited thereto, and in an embodiment, the second transistor TR2 is a metal oxide transistor.

The semiconductor pattern SC1 includes a first region that has a relatively high conductivity and a second region that has a relatively low conductivity. The first region may be doped with an N-type dopant or a P-type dopant. A P-type transistor includes a region doped with the P-type dopant, and an N-type transistor includes a region doped with the N-type dopant. The second region is a non-doped region or a region doped at a concentration lower than that of the first region.

The first region has a conductivity greater than that of the second region and substantially serves as an electrode or a signal line. The second region substantially corresponds to an active area or a channel of the transistor. For example, a portion of the semiconductor pattern is the active area of the transistor, another portion of the semiconductor pattern is a source area or a drain area of the transistor, and the other portion of the semiconductor pattern is a connection electrode or a connection signal line.

A source area SE (or a source), an active area AC (or a channel), and a drain area DE (or a drain) of the second transistor TR2 are formed from the semiconductor pattern SC1. The source area SE and the drain area DE extend in opposite directions to each other from the active area AC in a cross-section.

A first insulating layer 10 is disposed on the buffer layer 10*bf*. The first insulating layer 10 commonly overlaps the pixels PX and covers the semiconductor pattern SC1. The first insulating layer 10 includes an inorganic layer and/or an organic layer and may have a single-layer or multi-layer structure. The inorganic layer includes at least one of aluminum oxide, titanium oxide, silicon oxide, silicon nitride, silicon oxynitride, zirconium oxide, or hafnium oxide. In a present embodiment, the first insulating layer 10 has a single-layer structure of a silicon oxide layer. In addition to the first insulating layer 10, an insulating layer of the circuit layer 120 described below is also an inorganic layer and/or an organic layer and has a single-layer or multi-layer structure. The inorganic layer includes at least one of the above-mentioned materials, however, embodiments are not necessarily limited thereto.

A gate GT of the second transistor TR2 is disposed on the first insulating layer 10. The gate GT is a portion of a metal pattern. The gate GT overlaps the active area AC. The gate GT is used as a mask in a process of doping the semiconductor pattern. The gate GT includes at least one of titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), or indium zinc oxide (IZO), etc., however, embodiments are not necessarily particularly limited.

A first electrode ST10 of a storage capacitor Cst is disposed on the first insulating layer 10. The first electrode ST10 is formed through the same process as the gate GT.

A second insulating layer 20 is disposed on the first insulating layer 10 and covers the gate GT and the first electrode ST10. A second electrode ST20 is disposed on the second insulating layer 20. A third insulating layer 30 is disposed on the second insulating layer 20 and covers the second electrode ST20.

A first connection electrode CNE1 is disposed on the third insulating layer 30. The first connection electrode CNE1 is connected to the drain area DE of the second transistor TR2 via a contact hole that penetrates through the first, second, and third insulating layers 10, 20, and 30.

A fourth insulating layer 40 is disposed on the third insulating layer 30 and covers the first connection electrode CNE1. A second connection electrode CNE2 is disposed on the fourth insulating layer 40. The second connection electrode CNE2 is connected to the first connection electrode CNE1 via a contact hole that penetrates through the fourth insulating layer 40.

A signal line formed through the same process as the second connection electrode CNE2 is disposed on the same layer as the second connection electrode CNE2. For example, a voltage line VL and the data line DL are disposed on the fourth insulating layer 40. The data line DL provides a data signal to the first transistor TR1, as shown in FIG. 4A.

The first transistor TR1 may have substantially the same stack structure as or a different stack structure from that of the second transistor TR2 shown in FIG. 4B. The first transistor TR1 shown in FIG. 4A includes an oxide semiconductor pattern disposed on a different layer from that on which the semiconductor pattern SC1 is disposed.

A fifth insulating layer 50 is disposed on the fourth insulating layer 40 and covers the second connection electrode CNE2, the voltage line VL, and the data line DL. The stack structure of the first insulating layer 10 to the fifth insulating layer 50 is an example, and embodiments are not necessarily limited thereto. In an embodiment, an additional conductive layer and insulating layer are disposed in addition to the first insulating layer 10 to fifth insulating layer 50.

Each of the fourth insulating layer 40 and the fifth insulating layer 50 includes an organic layer. For example, the organic layer includes a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, or a vinyl alcohol-based polymer, or blends thereof.

The light emitting element OLED includes a first electrode AE or an anode, a light emitting layer EL disposed on the first electrode AE, and a second electrode CE or a cathode disposed on the light emitting layer EL. The first electrode AE is disposed on the fifth insulating layer 50. The first electrode AE may be one of a semi-transmissive electrode, a transmissive electrode, or a reflective electrode. According to an embodiment, the first electrode AE includes a reflective layer formed of silver (Ag), magnesium (Mg), aluminum (Al), platinum (Pt), lead (Pd), copper (Cu), gold (Au), nickel (Ni), neodymium (Nd), iridium (Ir), chromium (Cr), or compounds thereof, and a transparent or semi-transparent electrode layer formed on the reflective layer. The transparent or semi-transparent electrode layer includes at least one of indium tin oxide (ITO), indium zinc oxide (IZO), indium gallium zinc oxide (IGZO), zinc oxide (ZnO), indium oxide ($In_2O_3$), or aluminum-doped zinc oxide (AZO). For instance, the first electrode AE has a stack structure of ITO/Ag/ITO.

A pixel definition layer PDL is disposed on the fifth insulating layer 50. According to an embodiment, the pixel definition layer PDL absorbs light. For example, the pixel definition layer PDL is black. The pixel definition layer PDL includes a black coloring agent. The black coloring agent may include a black dye or a black pigment. The black coloring agent may include carbon black or a metal, such as chromium, or an oxide thereof. The pixel definition layer PDL functions as a light blocking pattern that blocks light.

The pixel definition layer PDL covers a portion of the first electrode AE. For example, an opening PDL-OP is formed through the pixel definition layer PDL that exposes a portion of the first electrode AE. The opening PDL-OP of the pixel definition layer PDL defines the light emitting area PXA. The pixel definition layer PDL covers an edge of the first electrode AE and increases a distance between an edge of the first electrode AE and the second electrode CE. Accordingly, the pixel definition layer PDL prevents arcs from occurring at the edge of the first electrode AE by.

The light emitting layer EL includes different materials, depending on the emission colors of the light emitting element OLED. The first electrode AE and the light emitting layer EL are disposed in every pixels PX shown in FIG. 4A. For example, the first electrode AE and the light emitting layer EL are disposed in the light emitting areas PXA of each of the pixels PX.

The second electrode CE is disposed on the pixel definition layer PDL and the light emitting layer EL and overlaps the light emitting areas PXA and the non-light-emitting area NPXA. The second electrode CE receives a second source voltage ELVSS. The second source voltage ELVSS is a bias voltage that has a lower voltage level than the first source voltage ELVDD.

The second electrode CE includes a metal with a low work function. The second electrode CE includes a transparent or semi-transparent conductive layer. In an embodiment, the second electrode CE is formed by a co-deposition process and includes at least one of silver (Ag), magnesium (Mg), or mixtures thereof. In an embodiment, the second electrode CE is formed by a sputtering process and includes at least one of magnesium (Mg), lead (Pd), copper (Cu), or mixtures thereof.

A hole control layer is disposed between the first electrode AE and the light emitting layer EL. The hole control layer includes a hole transport layer and a hole injection layer. An electron control layer is disposed between the light emitting layer EL and the second electrode CE. The electron control layer includes an electron transport layer and an electron injection layer.

The second electrode CE is connected to the voltage line VL via a contact hole TH-V that penetrates through the pixel definition layer PDL and the fifth insulating layer 50 in the non-light-emitting area NPXA. The voltage line VL receives the second source voltage ELVSS. However, the electrical connection relationship between the second electrode CE and the voltage line VL is not necessarily limited thereto.

The encapsulation layer 140 is disposed on the display element layer 130. The encapsulation layer 140 includes an inorganic layer 141, an organic layer 142, and an inorganic layer 143 that are sequentially stacked, however, layers that form the encapsulation layer 140 are not necessarily limited thereto. The inorganic layers 141 and 143 include at least one of a silicon nitride layer, a silicon oxynitride layer, a silicon oxide layer, a titanium oxide layer, or an aluminum oxide layer. The organic layer 142 includes an acrylic-based organic layer, however, embodiments are not necessarily particularly limited.

Referring to FIG. 4C, in an embodiment, a voltage supply line VL-S is disposed in the non-display area DP-NDA. The voltage supply line VL-S receives the second source voltage ELVSS from outside of the display panel DP. The second electrode CE overlaps entire display area DP-DA. A portion of the second electrode CE is disposed in the non-display area DP-NDA. The second electrode CE is directly or indirectly connected to the voltage supply line VL-S in the non-display area DP-NDA and receives the second source voltage ELVSS.

The voltage line VL includes a plurality of voltage lines VL-1 of a first group, hereinafter referred to as first group voltage lines, that extend in the first direction DR1 and are spaced apart in the second direction DR2, and a plurality of voltage lines VL-2 of a second group, hereinafter referred to as second group voltage lines, that extend in the second direction DR2 and are spaced apart in the first direction DR1. One of the first group voltage lines VL-1 or the second group voltage lines VL-2 may be omitted. The first group voltage lines VL-1 and the second group voltage lines VL-2 have an integral shape and are disposed on different layers from each other. The first group voltage lines VL-1 and the second group voltage lines VL-2 are connected to the voltage supply line VL-S and supply the second source voltage ELVSS.

The first group voltage lines VL-1 and the second group voltage lines VL-2 are connected to the second electrode CE via the contact hole TH-V. A plurality of contact holes TH-V connect the first group voltage lines VL-1 and the second group voltage lines VL-2 to the second electrode CE. The first group voltage lines VL-I and the second group voltage lines VL-2 supply the second source voltage ELVSS to the second electrode CE.

The voltage line VL have a sheet resistance that is less than that of the second electrode CE. The voltage line VL have a sheet resistance equal to or less than about 1 $\Omega$/square, for example, about 0.1 $\Omega$/square or less, and a sheet resistance of the second electrode CE is within a range from about 10 $\Omega$/square to about 14 $\Omega$/square. The second electrode CE connected to the voltage line VL have a combined sheet resistance from about 1 $\Omega$/square to about 2 $\Omega$/square.

Since the second source voltage ELVSS is supplied to a plurality of points in the second electrode CE via the low sheet resistance voltage line VL, a voltage drop that occurs in a direction from outside to inside of the second electrode CE is reduced. This effect occurs largely in a medium-sized display device whose size is equal to or greater than about 12 inches rather than a small-sized display device such as a mobile phone. This is because the greater is the area of the second electrode CE is, the greater is the voltage drop.

Figure 5A:
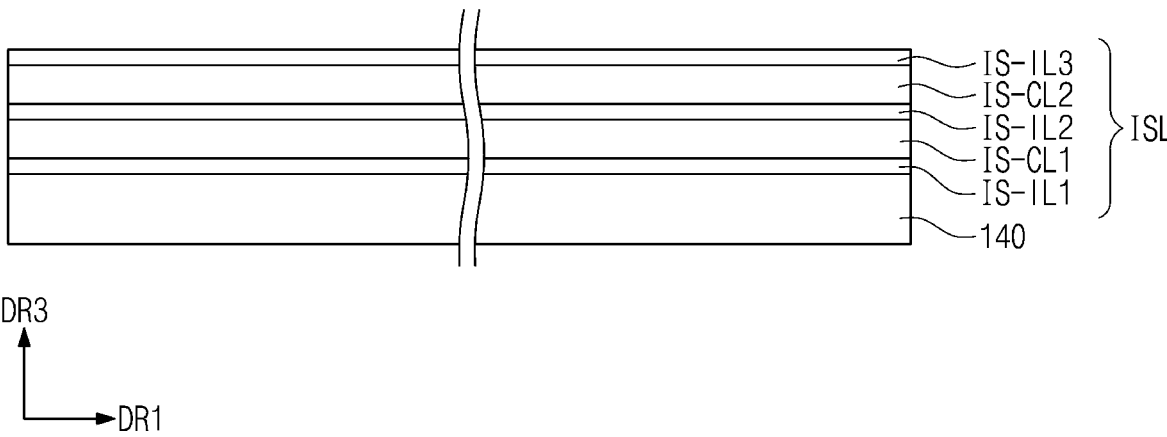
FIG. 5A is a cross-sectional view of an input sensor according to an embodiment of the present disclosure.
Figure 5B:
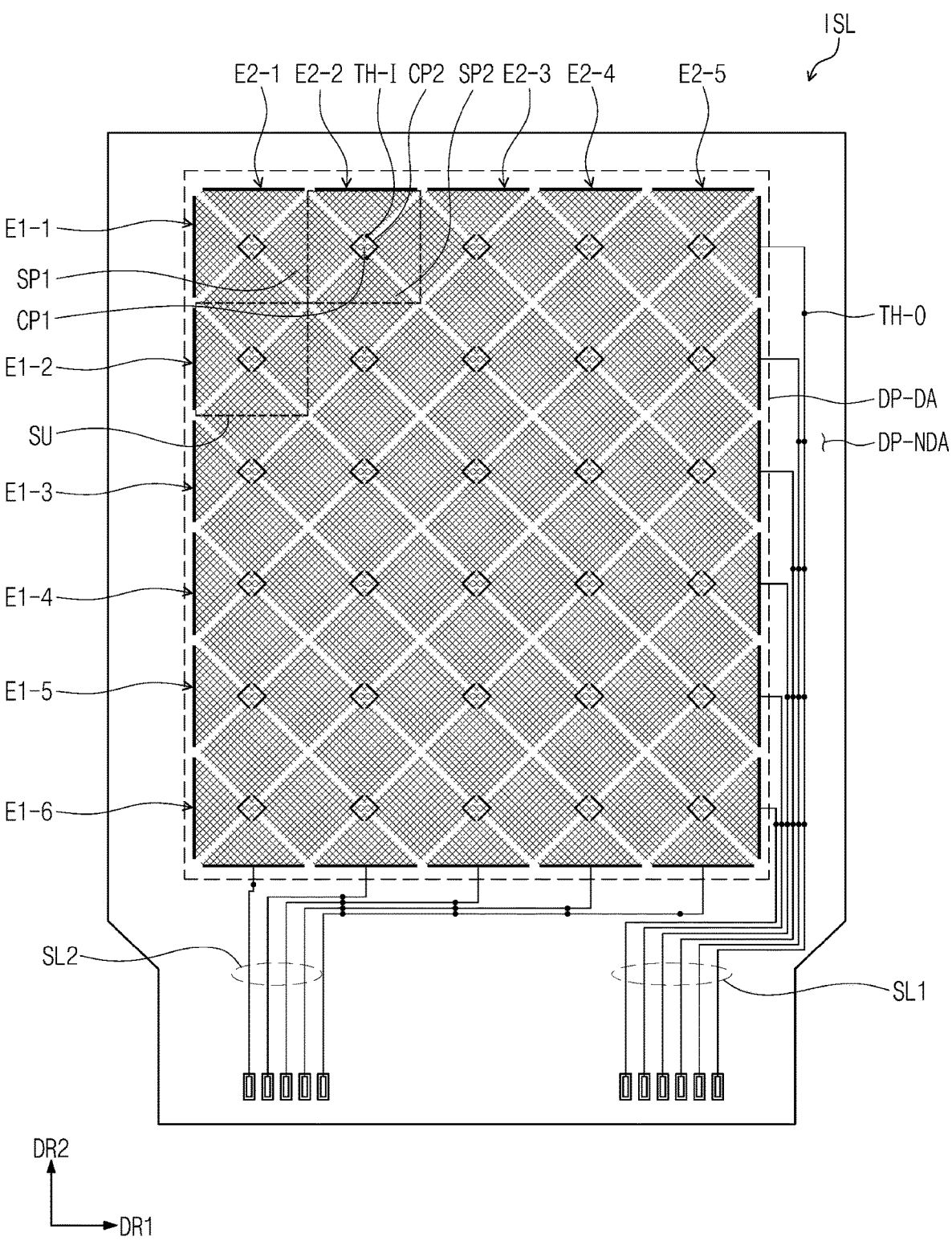
FIG. 5B is a plan view of an input sensor according to an embodiment of the present disclosure.
Figure 5C:
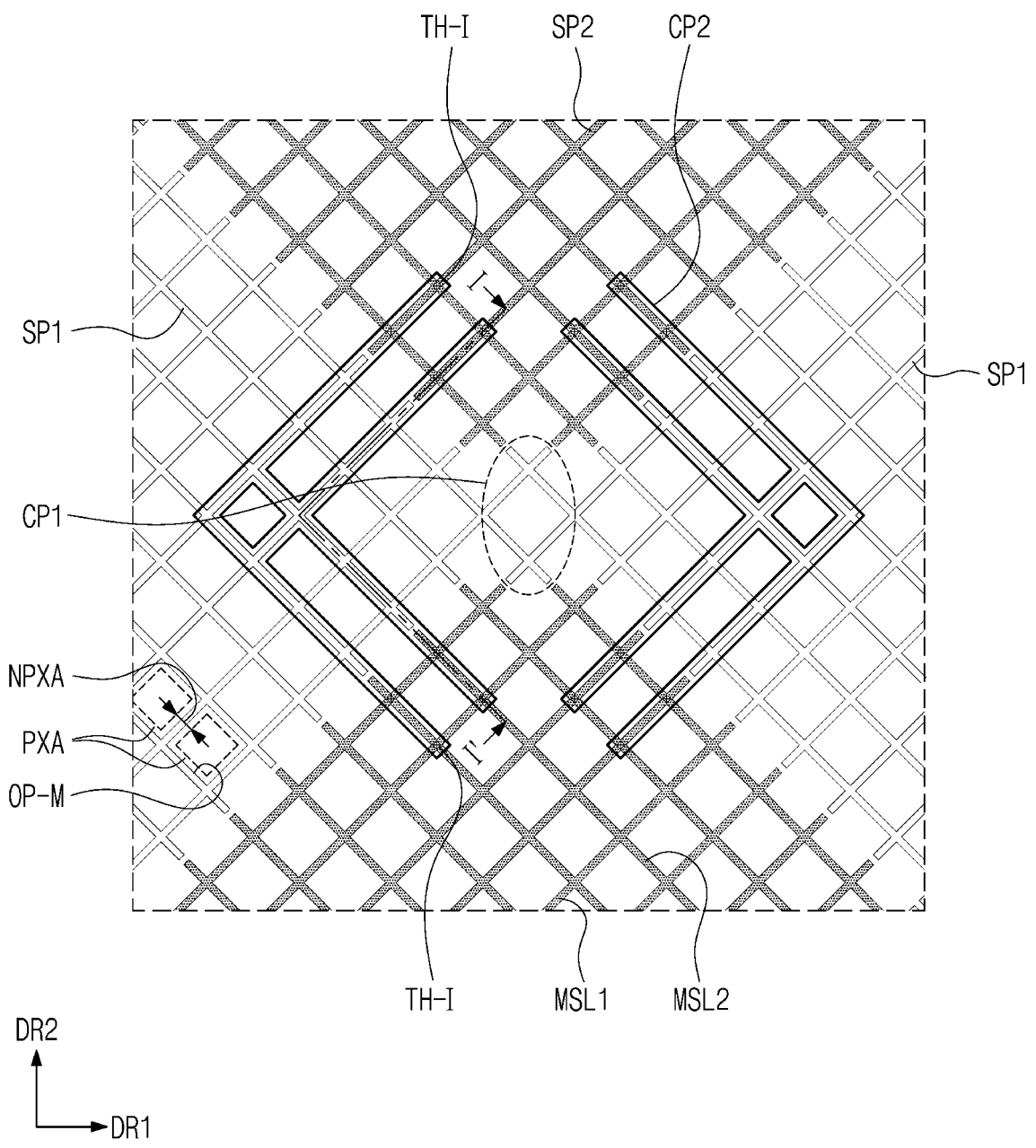
FIG. 5C is a plan view of a portion of an input sensor according to an embodiment of the present disclosure.
Figure 5D:
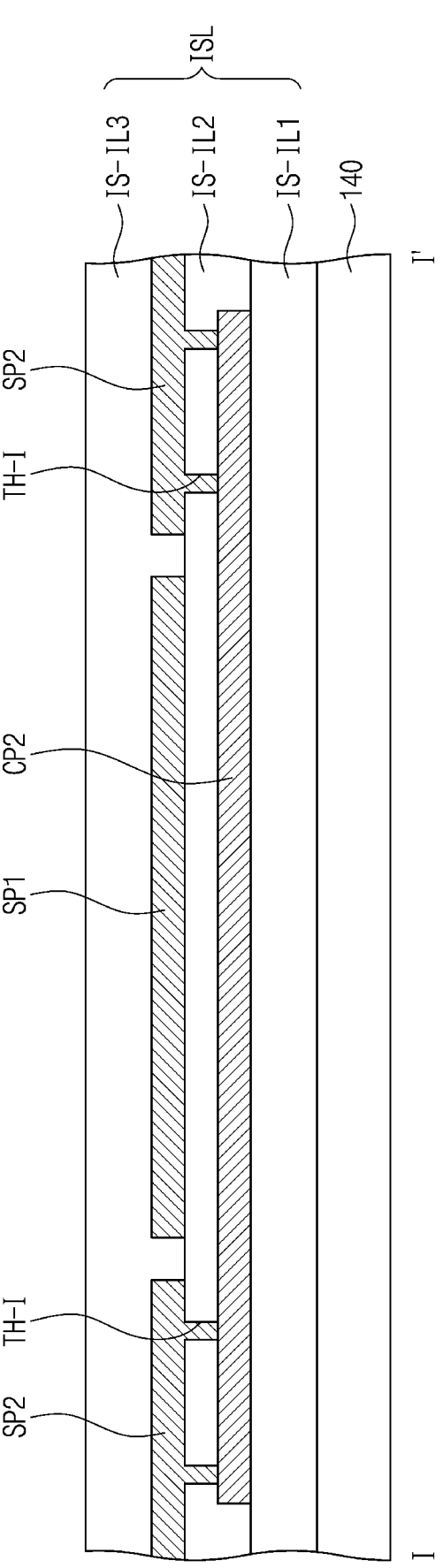
FIG. 5D is a cross-sectional view taken along a line I-I' of FIG. 5C.

FIG. 5A is a cross-sectional view of an input sensor ISL according to an embodiment of the present disclosure. FIG. 5B is a plan view of the input sensor ISL according to an embodiment of the present disclosure. FIG. 5C is a plan view of a portion of the input sensor ISL according to an embodiment of the present disclosure. FIG. 5D is a cross-sectional view taken along a line I-I' of FIG. 5C.

Referring to FIG. 5A, in an embodiment, the input sensor ISL includes a first insulating layer IS-IL1, a first conductive pattern layer IS-CL1, a second insulating layer IS-IL2, a second conductive pattern layer IS-CL2, and a third insulating layer IS-IL3. Each of the first and second insulating layers IS-IL1 and IS-IL2 includes at least one inorganic layer. The first insulating layer IS-IL1 is disposed directly on a thin film encapsulation layer 140. According to an embodiment, at least one of the first insulating layer IS-IL1 and/or the third insulating layer IS-IL3 can be omitted.

Each of the first and second insulating layers IS-IL1 and IS-IL2 includes at least one of silicon oxide, silicon oxynitride, silicon nitride, zirconium oxide, aluminum oxide, titanium oxide, or hafnium oxide. The third insulating layer IS-IL3 includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. According to an embodiment, the third insulating layer IS-IL3 should not be limited to an organic layer, and the third insulating layer IS-IL3 may include an inorganic layer or may be an adhesive layer.

Each of the first conductive pattern layer IS-CL1 and the second conductive pattern layer IS-CL2 includes a plurality of conductive patterns. The conductive patterns may have a single-layer structure or a multi-layer structure of layers stacked in the third directional axis DR3. The multi-layer conductive pattern includes two or more transparent conductive and metal layers. The multi-layer conductive pattern includes metal layers containing different metals from each other. The transparent conductive layer includes at least one of indium tin oxide (ITO), indium zinc oxide (IZO), zinc oxide (ZnO), indium tin zinc oxide (ITZO), PEDOT, metal nanowire, or graphene. The metal layer includes at least one of molybdenum, silver, titanium, copper, aluminum, or alloys thereof.

Referring to FIG. 5B, in an embodiment, the input sensor ISL includes a sensing electrode and a signal line connected to the sensing electrode. In a present embodiment, the sensing electrode includes first sensing electrodes E1-1 to E1-6 and second sensing electrodes E2-1 to E2-5 that cross the first sensing electrodes E1-1 to E1-6 and are insulated from the first sensing electrodes E1-1 to E1-6. The first sensing electrodes E1-1 to E1-6 and the second sensing electrodes E2-1 to E2-5 may be arranged in the display area DP-DA.

The signal line includes first signal lines SL1 connected to the first sensing electrodes E1-1 to E1-6 and second signal lines SL2 connected to the second sensing electrodes E2-1 to E2-5. The first signal lines SL1 and the second signal lines SL2 overlap the non-display area DP-NDA. One of the first signal lines SL1 and the second signal lines SL2 transmits a transmission signal from an external circuit to a corresponding electrode to sense an external input, and the other one of the first signal lines SL1 and the second signal lines SL2 transmits as a reception signal a variation in capacitance between the first sensing electrodes E1-1 to E1-6 and the second sensing electrodes E2-1 to E2-5 to the external circuit.

In a present embodiment, the first signal lines SL1 is disposed at one side of the display area DP-DA, however, embodiments are not necessarily limited thereto. In an embodiment, first signal lines SL1 connected to one side of a corresponding first electrode and first signal lines SL1 connected to the other side of the corresponding first electrode are respectively disposed at both sides of the display area DP-DA such that the display area DP-DA is disposed therebetween. For example, the signal line is connected to both ends of the first sensing electrodes E1-1 to E1-6. As the first signal lines SL1 are divided and disposed at both sides of the display area DP-DA, a size of the non-display area DP-NDA can be reduced.

Each of the first signal lines SL1 and the second signal lines SL2 includes a line of a first layer and a line of a second layer that are disposed on different layers from each other. The line of the first layer is formed from the first conductive pattern layer IS-CL1 of FIG. 5A, and the line of the second layer is formed from the second conductive pattern layer IS-CL2 of FIG. 5A. FIG. 5B shows a contact hole TH-O that connects the line of the first layer and the line of the second layer as a representative example. The contact hole TH-O penetrates through the second insulating layer IS-IL2, shown in FIG. 5A. However, embodiments are not necessarily limited thereto. According to an embodiment, each of the first signal lines SL1 and the second signal lines SL2 includes only the line of the first layer or the line of the second layer.

Each of the first sensing electrodes E1-1 to E1-6 and the second sensing electrodes E2-1 to E2-5 has a mesh shape in which a plurality of openings are formed. The openings correspond to the light emitting area PXA of the display panel DP, shown in FIG. 4B. The second sensing electrodes E2-1 to E2-5 are insulated from the first sensing electrodes E1-1 to E1-6 while crossing the first sensing electrodes E1-1 to E1-6. One of the first sensing electrodes E1-1 to E1-6 and the second sensing electrodes E2-1 to E2-5 has an integral shape. In an embodiment of FIG. 5B, the first sensing electrodes E1-1 to E1-6 are shown as having an integral shape as a representative example. The first sensing electrodes E1-1 to E1-6 include first sensing portions SP1 and first intermediate portions CP1. The first intermediate portions CP1 have a size that is relatively smaller than that of the first sensing portions SP1.

In addition, although the first intermediate portions CP1 are described as being distinct from the first sensing portions SP1, each of the first intermediate portions CP1 may be a portion of a corresponding one of the first sensing portions SP1. Each of the first intermediate portions CP1 may be divided to be included in two adjacent first sensing parts SP1. For example, the first sensing electrodes E1-1 to E1-6, which have an integral shape, include a plurality of first sensing parts SP1 arranged along the first direction DR1.

Each of the second sensing electrodes E2-1 to E2-5 includes second sensing portions SP2 and second intermediate portions CP2. The second sensing portions SP2 are spaced apart from each other and may be defined as sensing patterns SP2.

Each of the second intermediate portions CP2 are disposed on different layer from the second sensing portions SP2 and form bridge patterns CP2 that connect the spaced apart sensing patterns SP2 to each other. Two adjacent sensing patterns SP2 are connected to two bridge patterns CP2, however, the number of the bridge patterns CP2 is not necessarily limited to two. The second intermediate patterns CP2 are formed by patterning the first conductive pattern layer IS-CL1 shown in FIG. 5A, and the first sensing electrodes E1-1 to E1-6 and the sensing patterns SP2 are formed by patterning the second conductive pattern layer IS-CL2.

As shown in FIG. 5B, the input sensor ISL includes a plurality of sensing unit areas SU. FIG. 5B shows three sensing unit areas SU as a representative example. The sensing unit areas SU have substantially the same size. Each of the sensing unit areas SU includes a cross area where one of the first sensing electrodes E1-1 to E1-6 intersects with one of the second sensing electrodes E2-1 to E2-5.

FIGS. 5C and SD show one cross area, according to an embodiment. The first sensing portion SP1, the first intermediate portion CP1, and the second sensing portions SP2 have a mesh shape. The first sensing portion SP1, the first intermediate portion CP1, and the second sensing portions SP2 include conductive lines MSL1 and MSL2. The conductive lines MSL1 and MSL2 extend in a direction that crosses the first direction DR1 and the second direction DR2 and extend in different directions from each other. The conductive lines MSL1 and MSL2 define a plurality of openings OP-M. The light emitting area PXA is inside the opening OP-M. The conductive lines MSL1 and MSL2 overlap the non-light-emitting area NPXA.

As shown in FIG. 5C, the second intermediate portion CP2 overlaps the first sensing portions SP1. As shown in FIG. 5D, the second intermediate portion CP2 is connected to the second sensing portions SP2 via contact holes TH-I formed through the second insulating layer IS-IL2.

Figure 6A:
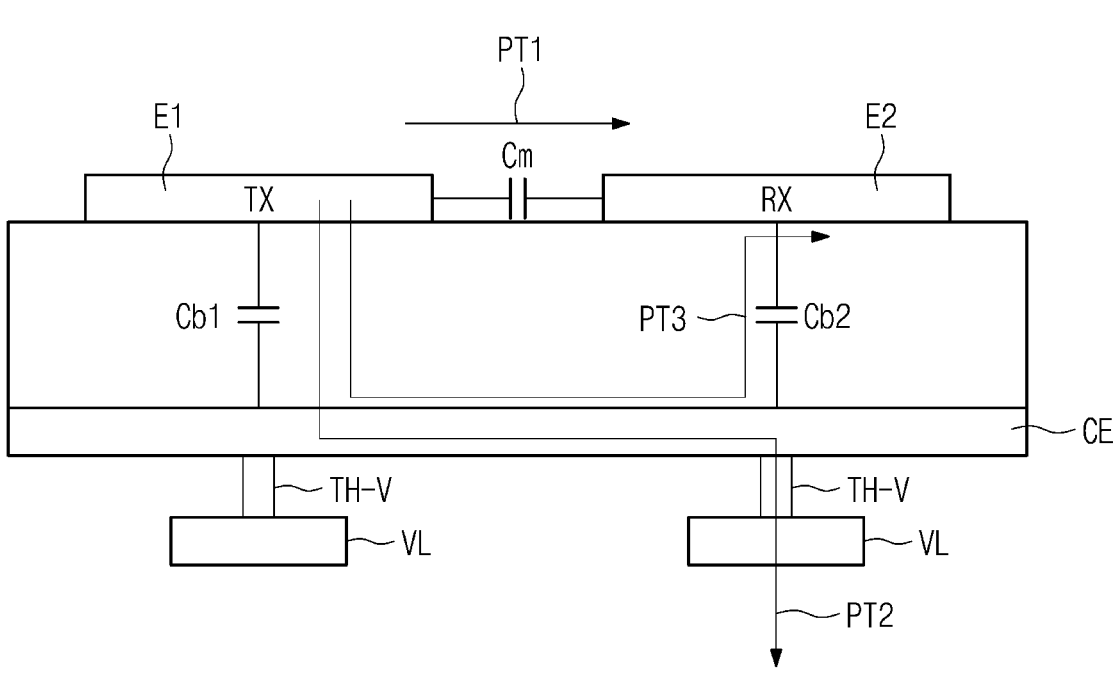
FIG. 6A is a cross-sectional view of an input sensor according to an embodiment of the present disclosure.
Figure 6B:
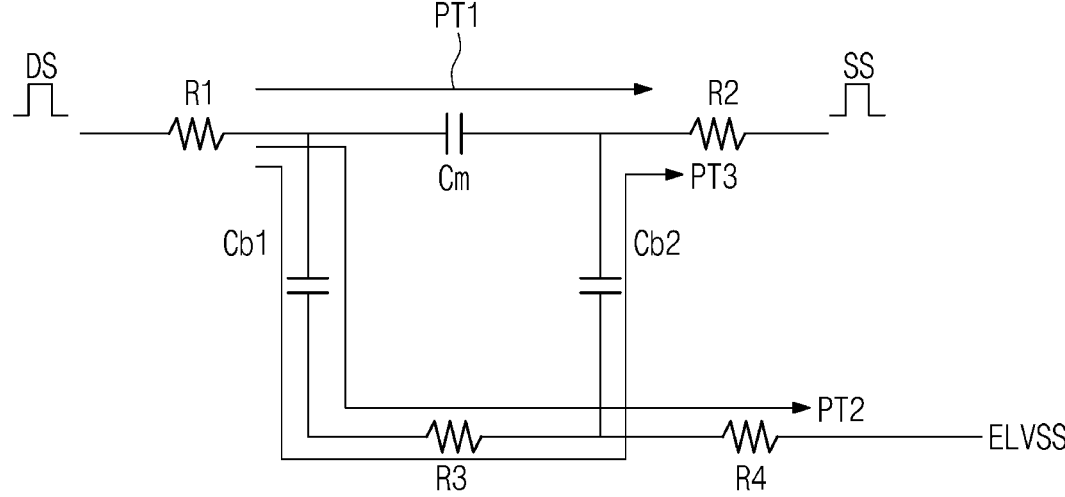
FIG. 6B is an equivalent circuit diagram of an input sensor according to an embodiment of the present disclosure.

FIG. 6A is a cross-sectional view of the input sensor ISL according to an embodiment of the present disclosure. FIG. 6B is an equivalent circuit diagram of the input sensor ISL according to an embodiment of the present disclosure.

FIGS. 6A and 6B show an input sensor with respect to one sensing unit area SU of FIG. 5B. In FIG. 6A, a configuration of the input sensor ISL and the display panel DP are schematically shown. A first sensing electrode E1 and a second sensing electrode E2 shown in FIG. 6A substantially correspond to the first sensing portion SP1 and the second sensing portion SP2 shown in FIG. 5B.

An embodiment of FIGS. 6A and 6B assumes that a transmission or driving signal DS is transmitted through the first sensing electrode E1. A mutual capacitance Cm forms between the first sensing electrode E1 and the second sensing electrode E2 as the first sensing electrode E1 and the second sensing electrode E2 are capacitively coupled to each other. The mutual capacitance Cm is changed by the touch event, and a sensing circuit of the input sensor ISL measures a variation of the capacitance Cm from the reception or sensing signal SS passing through a first path PT1.

The first sensing electrode E1 and the second sensing electrode E2 form a first parasitic capacitance Cb1 and a second parasitic capacitance Cb2, respectively, with the second electrode CE, hereinafter referred to as a common electrode, disposed under the first sensing electrode E1 and the second sensing electrode E2. The voltage line VL disposed in the display area DP-DA overlaps at least one of the first sensing electrode E1 and the second sensing electrode E2. Two voltage lines VL that respectively overlap the first sensing electrode E1 and the second sensing electrode E2 are shown as a representative example.

In FIG. 6B, R1 denotes an equivalent resistance of the first sensing electrode E1, R2 denotes an equivalent resistance of the second sensing electrode E2, and R3 denotes an equivalent resistance of the common electrode CE. R4 denotes an equivalent resistance of the voltage line VL.

The transmission signal DS flows not only through the first path PT1 but also through a path formed by the first parasitic capacitance Cb1 and the equivalent resistance of the common electrode CE. However, according to a present embodiment, a second path PT2 along the voltage line VL has a relatively low impedance when compared with that of a third path PT3 that passes through the second parasitic capacitance Cb2. This is because the voltage line VL has low sheet resistance as described above with reference to FIG. 4C.

A current flowing through the third path PT3 changes the reception signal SS, and may cause an error that is interpreted as an occurrence of a touch event. According to a present embodiment, as the second path PT2 is formed, the current flow through the third path PT3 can be suppressed, and thus, the sensitivity of the input sensor is increased.

Figure 7A:
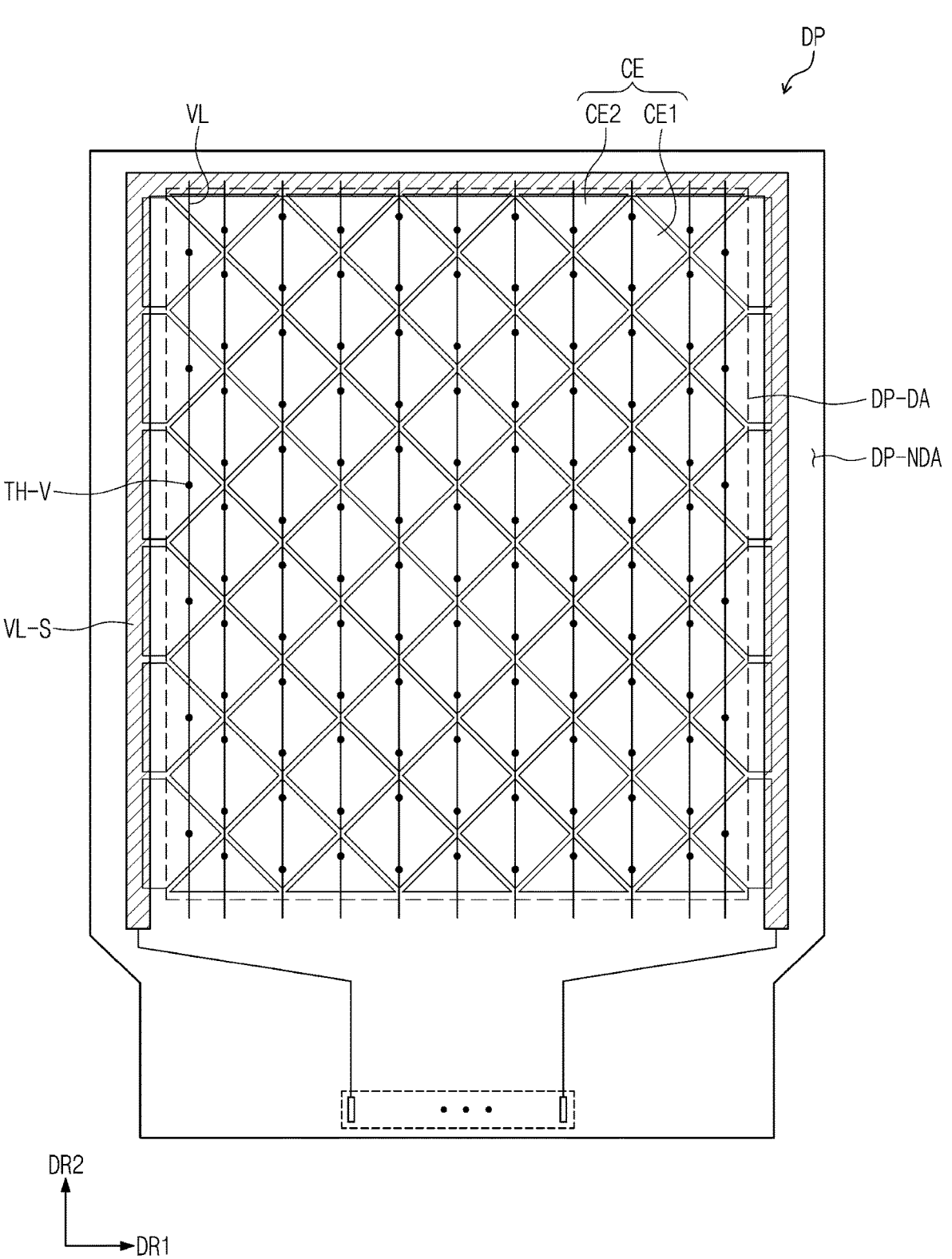
FIG. 7A is a plan view of a second electrode according to an embodiment of the present disclosure.
Figure 7B:
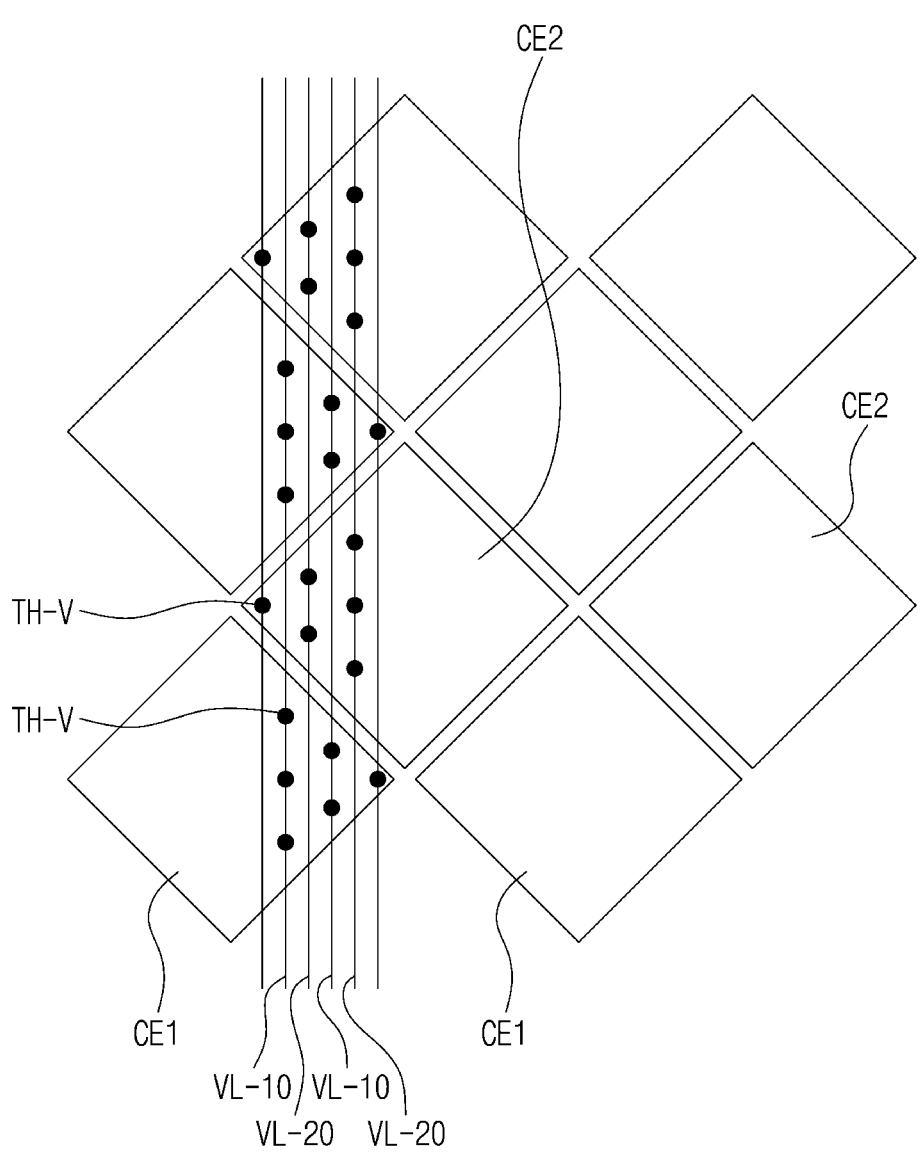
FIG. 7B is an enlarged plan view of a portion of a second electrode of FIG. 7A.
Figure 7C:
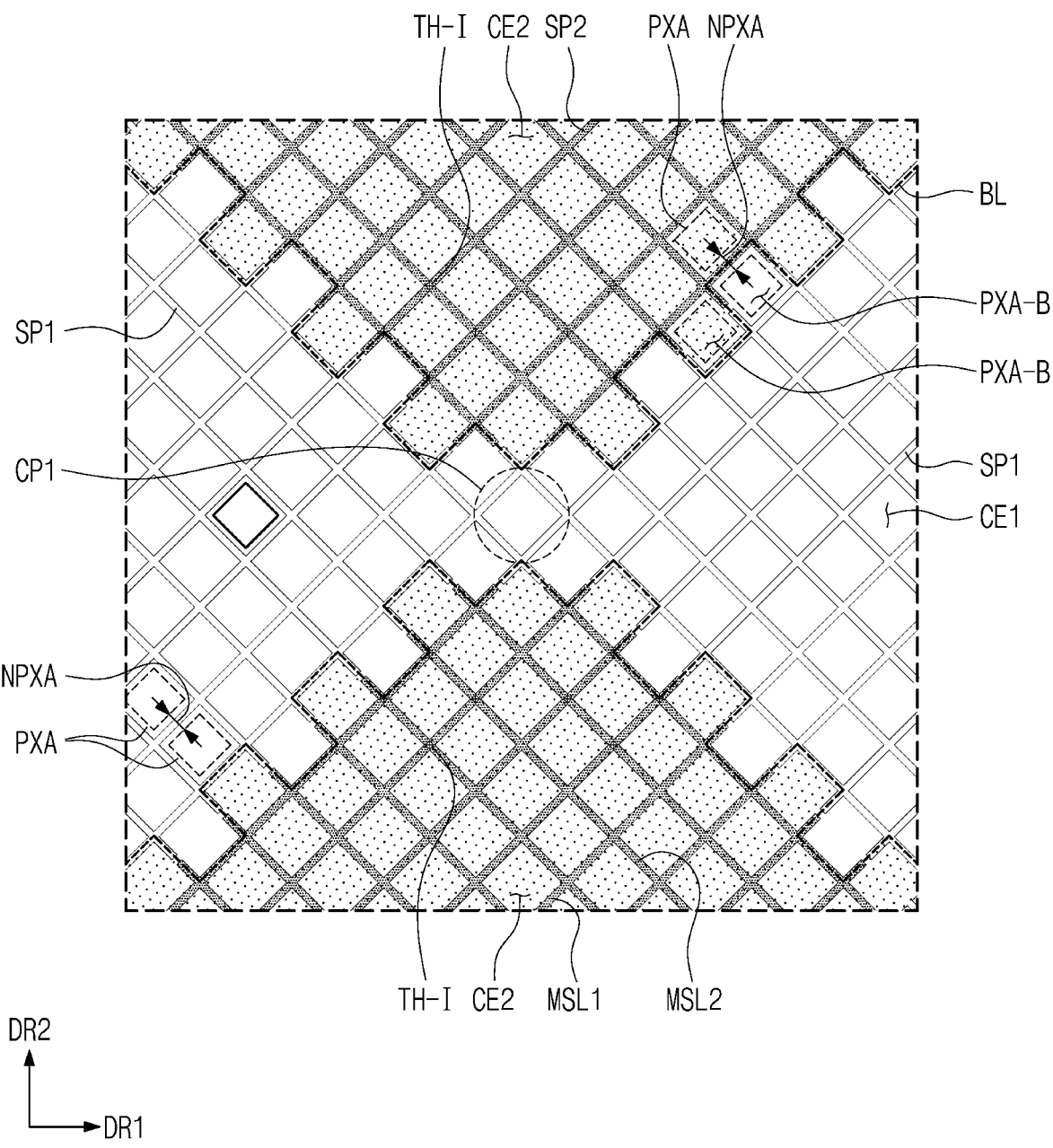
FIG. 7C is an enlarged plan view of a cross area that corresponds to FIG. 5C according to an embodiment of the present disclosure.
Figure 7D:
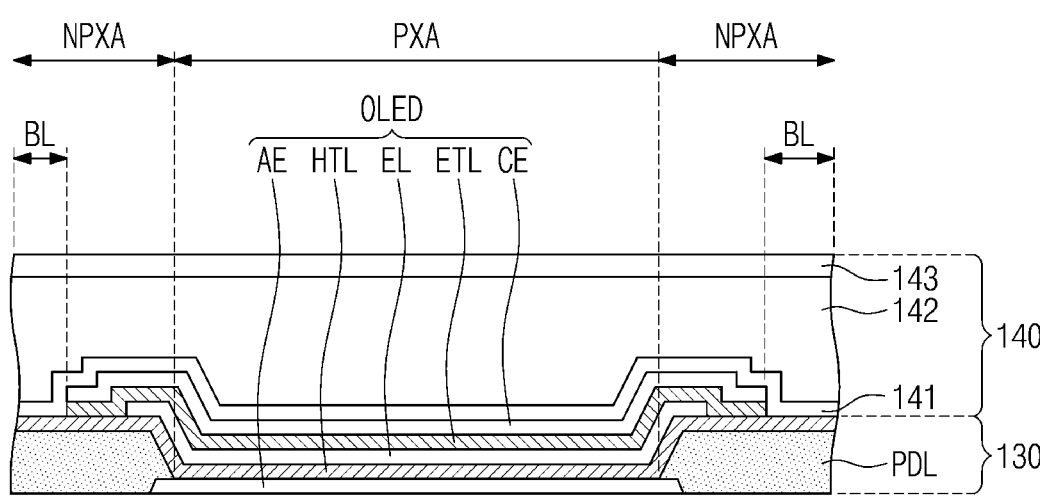
FIG. 7D is a cross-sectional view of a display device according to an embodiment of the present disclosure.
Figure 7D:

FIG. 7A is a plan view of a second electrode CE according to an embodiment of the present disclosure. FIG. 7B is an enlarged plan view of a portion of the second electrode CE of FIG. 7A. FIG. 7C is an enlarged plan view of a cross area, and FIG. 7D is a cross-sectional view of a display device DD according to an embodiment of the present disclosure.

Referring to FIG. 7A, in an embodiment, the second electrode CE includes a first electrode portion CE1 that corresponds to the first sensing electrodes E1-1 to E1-6, shown in FIG. 5B, and a second electrode portion CE2 spaced apart from the first electrode portion CE1 and that corresponds to the second sensing electrodes E2-1 to E2-5, shown in FIG. 5B. The reason that the second electrode CE includes the first electrode portion CE1 and the second electrode portion CE2 disposed spaced apart from the first electrode portion CE1 is to further increase the impedance of the third path PT3 of FIG. 6B, and this will be described in detail below.

A plurality of each of the first electrode portions CE1 and the second electrode portions CE2 are provided. The first electrode portion CE1 and the second electrode portion CE2 receive the second source voltage ELVSS. This is because the first electrode portion CE1 and the second electrode portion CE2 correspond to the second electrode CE of the light emitting element OLED shown in FIG. 4B. Although the first electrode portion CE1 and the second electrode portion CE2 receive the same volage, the first electrode portion CE1 and the second electrode portion CE2 are not directly connected to each other in the display area DP-DA.

Referring to FIG. 7B, in an embodiment, the first electrode portion CE1 overlaps the first sensing portion SP1, shown in FIG. 5B, and has a shape similar to a shape defined by an outer edge of the first sensing portion SP1. FIG. 7B shows the first electrode portion CE1 as having a diamond shape that corresponds to a diamond shape of first sensing portion SP1, as shown in FIG. 5B. The second electrode portion CE2 also overlaps the second sensing portion SP2 and has a shape similar to a shape defined by an outer edge of the second sensing portion SP2, shown in FIG. 5B.

According to a present embodiment, the first electrode portions CE1 are arranged in a matrix form. The second electrode portions CE2 are arranged in a matrix form in an area in which the first electrode portions CE1 are not arranged. One first electrode portion CE1 is surrounded by four second electrode portions CE2 in a cross direction that crosses the first direction DR1 and the second direction DR2. Similarly, one second electrode portion CE2 is surrounded by four first electrode portions CEL.

According to an embodiment, the first electrode portions CE1 adjacent to each other in the first direction DR1 are connected to each other and are integrally provided with each other. The first electrode portion CE1 includes a portion that corresponds to the first sensing portion SP1 and a portion that corresponds to the first intermediate portion CP1.

The voltage line VL includes a plurality of first group voltage lines VL-10 that extend in the second direction DR2 and a plurality of second group voltage lines VL-20 that extend in the second direction DR2. The first group voltage lines VL-10 are alternately arranged in the first direction DR1 with the second group voltage lines VL-20.

Each of the first group voltage lines VL-10 overlaps the first electrode portion CE1 and the second electrode portion CE2. Each of the second group voltage lines VL-20 overlaps the first electrode portion CE1 and the second electrode portion CE2.

Each of the first group voltage lines VL-10is connected to the first electrode portion CE1 via the contact hole TH-V. The cross-sectional shape of the contact hole TH-V is as shown in FIG. 4B. Each of the first group voltage lines VL-10 is connected to the first electrode portions CE1 that are arranged in the second direction DR2. The first electrode portions CE1 connected to one first group voltage line VL-10 overlap the first sensing electrodes E1-1 to E1-6, respectively.

Each of the second group voltage lines VL-20 electrically connect the second electrode portions CE2 that are arranged in the second direction DR2. The second electrode portions CE2 connected to one second group voltage line VL-20 overlap one of the second sensing electrodes E2-1 to E2-5.

FIG. 7C is an enlarged plan view of a cross area that corresponds to FIG. 5C, however, the second intermediate portion CP2 is not shown in FIG. 7C. FIG. 7C additionally shows a boundary line BL between the first electrode portion CE1 and the second electrode portion CE2. The boundary line BL corresponds to an area in which the first electrode portion CE1 and the second electrode portion CE2 are spaced apart from each other.

The boundary line BL overlaps the non-light-emitting area NPXA. For example, the first electrode portion CE1 and the second electrode portion CE2 are spaced apart from each other in the non-light-emitting area NPXA. This is because the light emitting element OLED, shown in FIG. 4C, is formed only when the second electrode CE is disposed in the light emitting area PXA.

In a present embodiment, the first electrode portion CE1 overlaps the first sensing portion SP1 and the first intermediate portion CP1, however, embodiments are not necessarily limited thereto. According to an embodiment, a boundary line between the first electrode portion CE1 that corresponds to one first sensing portion SP1 and the first electrode portion CE1 that corresponds to another first sensing portion SP1 is located in an area that overlaps the first intermediate portion CP1.

In a boundary area between the first sensing portion SP1 and the second sensing portion SP2, a portion of the first electrode portion CE1 overlaps the second sensing portion SP2. This can be confirmed by referring to the surroundings of a light emitting area PXA-B, hereinafter referred to as a boundary light emitting area, arranged in the boundary area of the first sensing portion SP1 and the second sensing portion SP2. This prevents the boundary line BL between the first electrode portion CE1 and the second electrode portion CE2 from being located in the boundary light emitting area PXA-B. For the same reason, a portion of the second electrode portion CE2 overlaps the first sensing portion SP1 in the boundary area between the first sensing portion SP1 and the second sensing portion SP2. In a case where a dummy portion or a dummy pattern is disposed between the first sensing portion SP1 and the second sensing portion SP2, the boundary line BL overlaps the dummy portion.

The boundary line BL may be formed by forming the integral-shaped second electrode CE as shown in FIG. 4C and patterning the second electrode CE, or may be formed in a manner of FIG. 7D, which will be described below. Descriptions will focus on differences between the light emitting element OLED shown in FIG. 7D and the light emitting element OLED shown in FIG. 4B. In FIG. 7D, the base layer 110 and the circuit element layer 120 are not shown for convenience of illustration.

Referring now to FIG. 7D, in an embodiment, a hole transport layer HTL is further disposed between the first electrode AE and the light emitting layer EL. The hole transport layer HTL overlaps the light emitting layer EL and the pixel definition layer PDL. The hole transport layer HTL entirely overlaps the display area DP-DA shown in FIG. 7A.

An electron transport layer ETL is disposed between the light emitting layer EL and the second electrode CE. The electron transport layer ETL does not entirely overlap the non-light-emitting area NPXA and is not disposed in portions of the non-light-emitting area NPXA. The electron transport layer ETL has substantially the same shape as that of the second electrode CE when viewed in a plan view.

Whether to deposit a material, such as magnesium, that forms the second electrode CE, can be determined depending on a surface state of a base layer on which the material is deposited. The magnesium is deposited on the electron transport layer ETL but not on the hole transport layer HTL. Since the electron transport layer ETL and the hole transport layer HTL, which include different materials from each other, have different surface properties, the magnesium can be selectively deposited only on the electron transport layer ETL. The deposition and formation of the second electrode CE is determined by using the electron transport layer ETL without a separate mask. The area in which the second electrode CE and the electron transport layer ETL are not disposed may correspond to the boundary line BL.

Figure 8A:
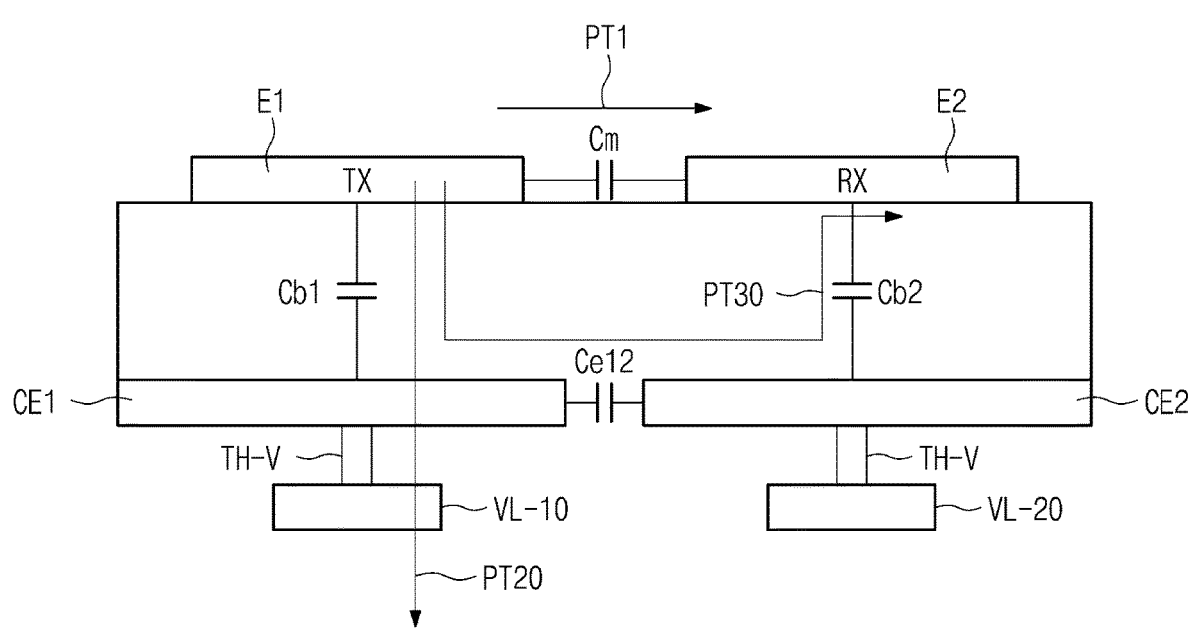
FIG. 8A is a cross-sectional view of an input sensor according to an embodiment of the present disclosure.
Figure 8B:
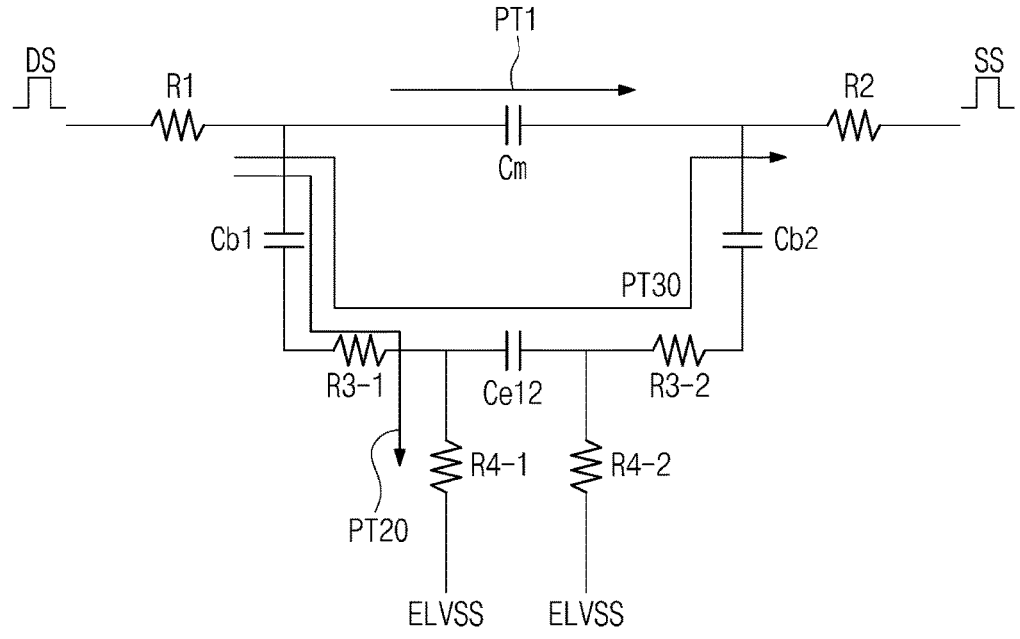
FIG. 8B is an equivalent circuit diagram of an input sensor according to an embodiment of the present disclosure.

FIG. 8A is a cross-sectional view of the input sensor ISL according to an embodiment of the present disclosure, and FIG. 8B is an equivalent circuit diagram of the input sensor ISL according to an embodiment of the present disclosure.

As described with reference to FIGS. 7A to 7D, since the second electrode CE is divided into the first electrode portion CE1 that corresponds to the first sensing electrodes E1-1 to E1-6, shown in FIG. 5B, and the second electrode portion CE2 that corresponds to the second sensing electrodes E2-1 to E2-5, shown in FIG. 5B, the equivalent circuit of the input sensor ISL changes.

Referring to FIGS. 8A and 8B, in an embodiment, a third parasitic capacitance Ce12 is added between the first electrode portion CE1 and the second electrode portion CE2. A second path PT20 has substantially the same impedance as that of the second path PT2 shown in FIGS. 6A and 6B, however, a third path PT30 has an impedance larger than that of the third path PT3 shown in FIGS. 6A and 6B. Accordingly, a current flow through the third path PT30 is reduced. In FIG. 8B, R3-1 denotes an equivalent resistance of the first electrode portion CE1, and R3-2 denotes an equivalent resistance of the second electrode portion CE2. R4-1 denotes an equivalent resistance of the first group voltage line VL-10, and R4-2 denotes an equivalent resistance of the second group voltage line VL-20.

Figure 9:
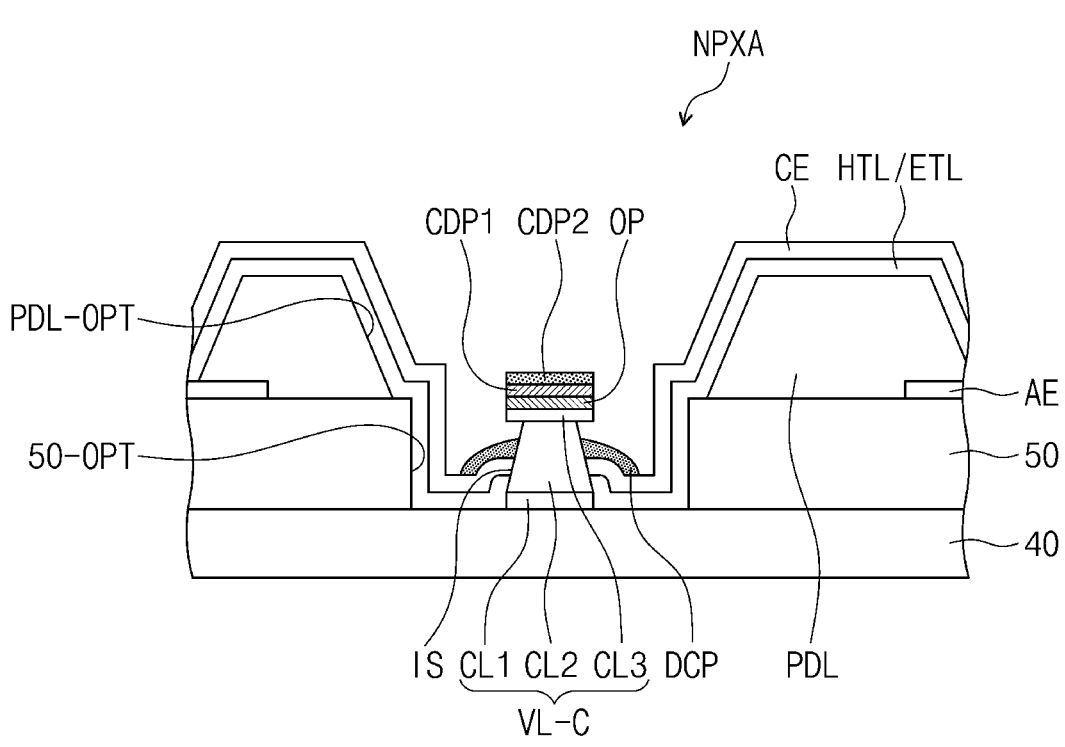
FIG. 9 is a cross-sectional view of a display panel according to an embodiment of the present disclosure.

FIG. 9 is a cross-sectional view of a display panel DP according to an embodiment of the present disclosure. FIG. 9 shows a connection structure that differs from the connection structure between the voltage line VL and the second electrode CE shown in FIG. 4B. The connection structure of FIG. 9 applies to the connection structure between the first group voltage line VL-10 and the first electrode portion CE1 shown in FIG. 7B and the connection structure between the second group voltage line VL-20 and the second electrode portion CE2 shown in FIG. 7B.

FIG. 9 shows a connection portion VL-C of a voltage line VL as a representative example of the voltage line VL. The connection portion VL-C has a multi-layer structure. The connection portion VL-C includes a first layer CL1 that has a relatively large coupling force to an insulating layer, a second layer CL2 that has a relatively large electrical conductivity, and a third layer CL3 that has a relatively small reflectance and a high corrosion resistance. The voltage line VL is a stack structure of titanium (Ti)/aluminum (Al)/titanium (Ti).

The highly electrically conductive second layer CL2 has a thickness greater than that of the first layer CL1 and the third layer CL3, which increases an electrical conductivity of the voltage line VL. The thickness of the first layer CL1 and the third layer CL3 that secure the above-described function is not necessarily particularly limited.

The second layer CL2 has an etch rate with respect to an etchant that differs from that of the first layer CL1 and the third layer CL3. In a process of patterning the voltage line VL, an inclined side surface IS is formed on an over-etched second layer CL2.

An opening 50-OPT is formed through a fifth insulating layer 50 that exposes the connection portion VL-C. An opening PDL-OPT is formed through a pixel definition layer PDL that corresponds to the opening 50-OPT of the fifth insulating layer 50.

The second electrode CE formed through the deposition process is in contact with the inclined surface IS of the second layer CL2. The inclined surface IS increases a contact area of the second electrode CE with respect to the second layer CL2.

In addition, an organic layer HTL/ETL is disposed under the second electrode CE. The organic layer HTL/ETL includes a hole transport layer HTL and an electron transport layer ETL. The organic layer HTL/ETL is also formed through a deposition process, and thus, the organic layer HTL/ETL is in contact with the inclined surface IS of the second layer CL2.

An organic pattern OP and a first conductive pattern CDP1 are sequentially stacked on an upper surface of the third layer CL3, which is exposed by the deposition process.

The organic pattern OP includes the same material as that of the organic layer HTL/ETL, and the first conductive pattern CDP1 includes the same material as that of the second electrode CE.

A dummy electrode DCP is disposed on the second electrode CE adjacent to the connection portion VL-C. The deposition process is further performed using a mask only in an area that corresponds to the connection portion VL-C. The dummy electrode DCP is in contact with the inclined surface IS of the second layer CL2 and an upper surface of the second electrode CE. Due to the dummy electrode DCP, a contact resistance between the voltage line VL and the second electrode CE is reduced. A second conductive pattern CDP2 is formed on the first conductive pattern CDP1 by the deposition process that forms the dummy electrode DCP. The second conductive pattern CDP2 includes the same material as the dummy electrode DCP.

The dummy electrode DCP includes at least one of indium tin oxide (ITO), indium zinc oxide (IZO), indium gallium zinc oxide (IGZO), zinc oxide (ZnO), indium oxide (In2O3), or aluminum-doped zinc oxide (AZO). According to an embodiment, the dummy electrode DCP is omitted.

FIG. 10A is a plan view of an input sensor ISL according to an embodiment of the present disclosure. FIG. 10B is an enlarged plan view of a sensing unit SU shown in FIG. 10A. FIG. 10C is an enlarged plan view of a second electrode CE that corresponds to the sensing unit SU shown in FIG. 10A.

Hereinafter, the input sensor ISL according to a present embodiment will be described by focusing on differences from the input sensor ISL shown in FIGS. SA to SD. The differences between the input sensor ISL shown in FIG. 10A and the input sensor ISL shown in FIGS. SA to SD are as described below.

According to an embodiment, FIG. 10A shows six first sensing electrodes E1-1 to E1-6 as a representative example. First signal lines of a first group SL1-1 of first signal lines SL1 are connected to first ends of some of the first sensing electrodes E1-1 to E1-6, respectively. First signal lines of a second group SL1-2 of the first signal lines SL1 are connected to second ends of the remaining first sensing electrodes E1-1 to E1-6, respectively. Second signal lines of a first group SL2-1 of the second signal lines SL2 are connected to first ends of some of the second sensing electrodes E2-1 to E2-5. Second signal lines of a second group SL2-2 of the second signal lines SL2 are connected to first ends of the remaining the second sensing electrodes E2-1 to E2-5. The first group SL1-1 of the first signal lines SL1 and the first group SL2-1 of the second signal lines SL2 are aligned with each other, and the second group SL1-2 of the first signal lines SL1 and the second group SL2-2 of the second signal lines SL2 are aligned with each other.

According to a present embodiment, the first sensing electrodes E1-1 to E1-6 include first sensing portions SP1 and first intermediate portions CP1 that include a bridge pattern. Each of the second sensing electrodes E2-1 to E2-5 includes second sensing portions SP2 and second intermediate portions CP2 that have an integral shape. Each of the first sensing electrodes E1-1 to E1-6 and the second sensing electrodes E2-1 to E2-5 has a mesh shape. For example, each of the first sensing electrodes E1-1 to E1-6 and the second sensing electrodes E2-1 to E2-5 includes a plurality of conductive lines that cross each other and form the mesh shape.

Referring to FIG. 10B, in an embodiment, each of the sensing unit areas SU includes half of a first sensing portion SP1 and half of another first sensing portion SP1 that are disposed with the first intermediate portion CP1 interposed therebetween. In addition, each of the sensing unit areas SU includes half of a second sensing portion SP2 and half of another second sensing portion SP2 that are disposed with the second intermediate portion CP2 interposed therebetween.

Each of the second sensing portions SP2 includes extension portions SP2a and SP2b and branch portions SP2c*l* to SP2c4. The extension portions SP2a and SP2b include a first extension portion SP2a that extends in the first direction DR1 and second extension portions SP2b that extend from the first extension portion SP2a in a first cross direction Dra and a second cross direction DRb that crosses the first cross directions Dra such that a second dummy pattern DUP2 is disposed therebetween. However, embodiments are not necessarily limited. According to an embodiment, no second dummy pattern DUP2 is disposed between the second extension portions SP2b, and the second extension portion SP2b extends in a direction substantially parallel to the first extension portion SP2a.

The branch portions SP2c*l* to SP2c4 extends in directions away from the second intermediate portion CP2 interposed therebetween. The branch portions SP2c*l* to SP2c4 include first, second, third, and fourth branch portions SP2c*l*, SP2c2, SP2c3, and SP2c4. The first branch portion SP2c*l* and the fourth branch portion SP2c4 extend in the first cross direction DRa, and the second branch portion SP22 and the third branch portion SP2c3 extend in the second cross direction DRb.

The first cross direction DRa is a direction that crosses each of the first direction DR1 and the second direction DR2. The second cross direction DRb crosses each of the first direction DR1 and the second direction DR2 and is substantially perpendicular to the first cross direction DRa. Each of the first cross direction DRa and the second cross direction DRb correspond to a diagonal direction between the first direction DR1 and the second direction DR2 on a plane surface defined by the first direction DR1 and the second direction DR2.

The second intermediate portion CP2 is disposed between portions of the first sensing portions SP1 that protrude toward each other along the first direction DR1. The second intermediate portion CP2 connects the first extension portions SP2a of the second sensing portions SP2. The second intermediate portion CP2 is disposed on the same layer as the first extension portions SP2a and is integrally formed with the first extension portions SP2a.

Each of the first sensing portions SP1 includes a first portion SP1b that extends in the first direction DR1 and a second portion SP1a that extends from the first portion SP1b and surrounds a portion of the second sensing portions SP2. The second portion SP1a of the first sensing portions SP1 surrounds the branch portions SP2c*l* to SP2c4 of the second sensing portion SP2 that are disposed adjacent thereto. Referring to FIG. 10B, in an embodiment, the second portion SP1a of the first sensing portion SP1 disposed at a left side of the sensing unit SU surrounds the first and third branch portions SP2c1 and SP2c3, and the second portion SP1a of the first sensing portion SP1 disposed at a right side of the sensing unit SU surrounds the second and fourth branch portions SP2c2 and SP2c4.

The first portions SP1b of the first sensing portions SP1 are spaced apart from each other in the first direction DR1 with the second intermediate portion CP2 interposed therebetween. The first intermediate portion CP1 electrically connects the spaced apart first sensing portions SP1. FIG. 10B shows two first intermediate portions CP1 disposed in the sensing unit SU. However, the number of the first intermediate portions CP1 disposed in the sensing unit SU is not necessarily limited thereto, and in other embodiments is less than or greater than two.

As shown in FIG. 10B, in an embodiment, the first intermediate portions CP1 have a turned V shape or a V shape when viewed in a plan view. The turned V shaped or the V shaped first intermediate portions CP1 overlap the second sensing portions SP2, however, embodiments are not necessarily limited thereto. According to an embodiment, the first intermediate portions CP1 have a straight line shape that extends in the first direction DR1 and overlaps the second intermediate portion CP2 when viewed in a plan view.

The dummy patterns DUP are electrically floated. The dummy patterns DUP are insulated from the first sensing electrodes E1-1 to E1-6 and the second sensing electrodes E2-1 to E2-5. The dummy patterns DUP include first, second, third, and fourth dummy patterns DUP1, DUP2, DUP3, and DUP4, according to their positions.

The first dummy patterns DUP1 are disposed between the first sensing electrodes E1-1 to E1-6 and the second sensing electrodes E2-1 to E2-5. For example, the first dummy patterns DUP1 are disposed between the first sensing portions SP1 and the second sensing portions SP2. For example, the first dummy patterns DUP1 are disposed between the second portions SP1a of the first sensing portions SP1 and the branch portions SP2c*l* to SP2c4 of the second sensing portions SP2 and surround the branch portions SP2c*l* to SP2c4 as shown in FIG. 10B.

The first dummy patterns DUP1 includes a plurality of patterns that are electrically insulated from each other. A size of the patterns changes according to the sensing unit SU by taking into account the mutual capacitance and the visibility. However, the first dummy patterns DUP1 are not necessarily limited thereto.

The second dummy patterns DUP2 is surrounded by the second extension portion SP2b of the second sensing portion SP2. The third dummy patterns DUP3 is surrounded by the first sensing portion SP1. The fourth dummy patterns DUP4 is disposed between the first sensing electrodes E1-1 to E1-6 arranged in the second direction DR2. However, in an embodiment, at least a portion of the first to fourth dummy patterns DUP1 to DUP4 is omitted.

FIG. 10C shows the second electrode CE that corresponds to the sensing unit area SU shown in FIG. 10B. Referring to FIGS. 10B and 10C, in an embodiment, the second electrode CE includes a first electrode portion CE1 that corresponds to the first sensing portion SP1 and a second electrode portion CE2 between adjacent first electrode portions CE1 and that corresponds to the second sensing portion SP2.

Referring to FIGS. 10B and 10C, two first electrode portions CE1 are arranged with the second electrode portion CE2 interposed therebetween in an area that corresponds to the sensing unit area SU. One first electrode portion CE1, hereinafter referred to as a left first electrode portion, corresponds to the second portion SP1a of the first sensing portion SP1, and the other first electrode portion CE1, hereinafter referred to as a right first electrode portion, corresponds to the first portion SP1b of the first sensing portion SP1.

Some of the first group voltage lines VL-10 are connected to the left first electrode portion CE1, and the other first group voltage lines VL-10 are connected to the right first electrode portion CE1. In addition, some of the first group voltage lines VL-10 are connected to the left first electrode portion CE1 in an area that corresponds to another sensing unit area SU.

In the area corresponding to the sensing unit area SU, the second electrode portion CE2 includes portions that correspond to the extension portions SP2*a* and SP2*b* and the branch portions SP2*c1* to SP2*c4* of FIG. 10B. In a present embodiment, the second electrode portion CE2 that corresponds to two second sensing portions SP2 and the second intermediate portion CP2 disposed between the two second sensing portions SP2 are shown.

The second electrode portion CE2 is connected to some of the second group voltage lines VL-20. The extension portions SP2*a* and SP2*b* and the branch portions SP2*c1* to SP2*c4* are connected to different second group voltage lines VL-20 from each other.

A portion of a boundary line between the first electrode portions CE1 and the second electrode portion CE2 is located on the first and fourth dummy patterns DUP1 and DUP4. The first electrode portion CE1 overlaps the third dummy pattern DUP3. The second electrode portion CE2 overlaps the second dummy pattern DUP2. In an area in which the first to fourth dummy patterns DUP1 to DUP4 are not disposed, the boundary between the first electrode portions CE1 and the second electrode portion CE2 is defined similar to that of FIG. 7C.

Although embodiments of the present disclosure have been described, it is understood that embodiments of the present disclosure are not limited to described embodiments, but that various changes and modifications can be made by: one ordinary skilled in the art within the spirit and scope of embodiments of the present disclosure as hereinafter claimed.

Therefore, the disclosed subject matter should not be limited to any single embodiment described herein, and the scope of embodiments of the present inventive concept shall be determined according to the attached claims.

What is claimed is:

1. A display device, comprising:

a display panel that includes a plurality of light emitting areas and a non-light-emitting area adjacent to the light emitting areas; and an input sensor disposed directly on the display panel and that includes a first sensing electrode and a second sensing electrode capacitively coupled to the first sensing electrode, wherein the display panel further comprises:

a first electrode portion that overlaps the first sensing electrode;

a second electrode portion spaced apart from the first electrode portion and that overlaps the second sensing electrode;

a voltage line of a first group connected to the first electrode portion;

a voltage line of a second group connected to the second electrode portion;

an insulating layer that is disposed between the first and second electrode portions and the voltage line of the first group and is disposed between the first and second electrode portions and the voltage line of the second group;

a plurality of first electrodes that overlaps the light emitting areas and are disposed between the first electrode portion and the insulating layer and between the second electrode portion and the insulating layer; and a plurality of light emitting layers, wherein each light emitting layer is disposed between a corresponding electrode portion of the first electrode portion and the second electrode portion and a corresponding first electrode of the first electrodes.

2. The display device of claim 1, wherein the first sensing electrode extends in a first direction, the second sensing electrode extends in a second direction that crosses the first direction, and each voltage line of the first group and each voltage line of the second group extends in the second direction.

3. The display device of claim 2, wherein the first sensing electrode includes a plurality of first sensing portions arranged in the first direction and first intermediate portions that connect adjacent first sensing portions, and the second sensing electrode includes a plurality of second sensing portions arranged in the second direction and second intermediate portions that connect adjacent second sensing portions, the first intermediate portions are disposed on a layer that differs from a layer on which the second intermediate portions are disposed, the voltage line of the first group is connected to a corresponding first sensing portion of the first sensing portions, and the voltage line of the second group is connected to each of the second sensing portions.

4. The display device of claim 2, wherein a plurality of voltage lines of the first group are provided, a plurality of voltage lines of the second group are provided, and voltage lines of the first group are alternately arranged in the first direction with voltage lines of the second group.

5. The display device of claim 1, wherein each voltage line of the first group and each voltage line of the second group overlaps the first electrode portion and the second electrode portion.

6. The display device of claim 1, wherein the voltage line of the first group and the voltage line of the second group receives a same bias voltage.

7. The display device of claim 1, wherein the display panel further comprises a voltage supply line disposed outside of the first sensing electrode and the second sensing electrode when viewed in a plan view, and the voltage line of the first group and the voltage line of the second group are electrically connected to the voltage supply line.

8. The display device of claim 1, wherein the voltage line of the first group is connected to the first electrode portion via a contact hole formed through the insulating layer.

9. The display device of claim 1, wherein each voltage line of the first group and each voltage line of the second group has a sheet resistance that is less than that of the first electrode portion and the second electrode portion.

10. The display device of claim 1, wherein the first electrode portion and the second electrode portion are spaced apart from each other in the non-light-emitting area.

11. The display device of claim 10, wherein the display panel further comprises an electron transport layer, wherein the electron transport layer is disposed between a corresponding light emitting layer of the plurality of light emitting layers and a corresponding electrode portion, and the electron transport layer is not disposed in an area where the first electrode portion and the second electrode portion are spaced apart from each other.

12. The display device of claim 1, wherein the voltage line of the first group comprises a first layer, a second layer disposed on the first layer, and a third layer disposed on the second layer, and the second layer has an electrical conductivity greater than that of the first layer and the third layer.

13. The display device of claim 12, wherein the second layer has a thickness greater than that of the first layer and the third layer, and the second layer comprises an inclined side surface.

14. The display device of claim 13, wherein the insulating layer includes an opening through which a portion of the voltage line of the first group is exposed, and the first electrode portion is in contact with the inclined side surface of the second layer in the opening.

15. The display device of claim 12, wherein the display panel further comprises:
an organic pattern disposed on the third layer; and
a conductive pattern disposed on the organic pattern.

16. The display device of claim 1, wherein the display panel further comprises a transistor and a connection electrode electrically connected to the transistor, and the voltage line of the first group and the voltage line of the second group are disposed on a same layer as a layer on which the connection electrode is disposed.

17. The display device of claim 1, wherein the display panel further comprises a transistor and a data line electrically connected to the transistor, and the voltage line of the first group and the voltage line of the second group are disposed on a same layer as a layer on which the data line is disposed.

18. A display device, comprising:
a display panel that includes a plurality of light emitting areas and a non-light-emitting area adjacent to the light emitting areas; and
an input sensor disposed directly on the display panel and that includes a first sensing electrode and a second sensing electrode capacitively coupled to the first sensing electrode,
wherein the display panel further comprises:
a voltage line that overlaps at least one of the first sensing electrode or the second sensing electrode;
an insulating layer disposed on the voltage line;
a first electrode disposed on the insulating layer and in each of the light emitting areas;
a pixel definition layer disposed on the insulating layer and that includes an opening formed therethrough that exposes the first electrode;
a light emitting layer disposed on the first electrode; and
a second electrode disposed on the pixel definition layer and the light emitting layer and that overlaps the light emitting areas, wherein the second electrode is electrically connected to the voltage line via a contact hole in the non-light-emitting area that penetrates through the insulating layer and the pixel definition layer.

19. The display device of claim 18, wherein the first sensing electrode extends in a first direction, the second sensing electrode extends in a second direction that crosses the first direction, and the voltage line includes at least one group of voltage lines of a first group that extend in the first direction or voltage lines of a second group that extend in the second direction.

20. The display device of claim 18, wherein
the voltage line comprises an inclined side surface,
the insulating layer includes a first opening formed therethrough that exposes a portion of the voltage line,
the pixel definition layer includes a second opening formed therethrough that corresponds to the first opening, and
the second electrode is in contact with the inclined side surface of the voltage line in the first opening.

21. An electronic display device, comprising:
a display panel that includes a plurality of light emitting areas and a non-light-emitting area adjacent to the light emitting areas; and
an input sensor disposed directly on the display panel and that includes a first sensing electrode and a second sensing electrode capacitively coupled to the first sensing electrode,
wherein the display panel further comprises:
a first electrode portion that overlaps the first sensing electrode;
a second electrode portion spaced apart from the first electrode portion and that overlaps the second sensing electrode;
a voltage line of a first group connected to the first electrode portion;
a voltage line of a second group connected to the second electrode portion; and
an insulating layer that is disposed between the first and second electrode portions and the voltage line of the first group and is disposed between the first and second electrode portions and the voltage line of the second group;
wherein the voltage line of the first group is connected to the first electrode portion via a contact hole formed through the insulating layer, and
each voltage line of the first group and each voltage line of the second group has a sheet resistance that is less than that of the first electrode portion and the second electrode portion.

22. The electronic display device of claim 21, further comprising:
a plurality of first electrodes that overlaps the light emitting areas and are disposed between the first electrode portion and the insulating layer and between the second electrode portion and the insulating layer; and
a plurality of light emitting layers, wherein each light emitting layer is disposed between a corresponding electrode portion of the first electrode portion and the second electrode portion and a corresponding first electrode of the first electrodes.

* * * * *